United States Patent [19]
Nishitani et al.

[11] Patent Number: 5,498,768
[45] Date of Patent: Mar. 12, 1996

[54] PROCESS FOR FORMING MULTILAYER WIRING

[75] Inventors: Eisuke Nishitani, Yokohama; Susumu Tsuzuku, Tokyo; Shigeru Kobayashi, Hiratsuka; Osamu Kasahara; Hiroki Nezu, both of Tokyo; Masakazu Ishino, Yokohama; Tsuyoshi Tamaru, Ome, all of Japan

[73] Assignee: Hitachi, Ltd., Tokyo, Japan

[21] Appl. No.: 87,027

[22] Filed: Jul. 6, 1993

Related U.S. Application Data

[63] Continuation of Ser. No. 742,447, Aug. 5, 1991, abandoned, and a continuation of Ser. No. 384,735, Jul. 24, 1989, abandoned.

[30] Foreign Application Priority Data

Jul. 27, 1988 [JP] Japan .................. 63-185598

[51] Int. Cl.$^6$ .................. H01L 21/441
[52] U.S. Cl. .................. 437/192; 437/937; 437/939
[58] Field of Search .................. 437/192, 937, 437/939, 946; 148/DIG. 17

[56] References Cited

U.S. PATENT DOCUMENTS

| | | | |
|---|---|---|---|
| 3,506,508 | 4/1970 | Nickl | 437/939 |
| 4,172,004 | 10/1979 | Alcorn | 427/97 |
| 4,351,697 | 9/1982 | Shanefield | 427/97 |
| 4,411,734 | 10/1983 | Maa | 437/192 |
| 4,517,225 | 5/1985 | Broadbent | 427/99 |
| 4,584,207 | 4/1986 | Wilson | 427/97 |
| 4,595,608 | 6/1986 | King et al. | 427/237 |
| 4,613,400 | 9/1986 | Tam et al. | 156/643 |
| 4,619,840 | 10/1986 | Goldman | 427/99 |
| 4,720,322 | 1/1988 | Tiffin | 427/97 |
| 4,741,928 | 5/1988 | Wilson | 427/99 |
| 4,776,087 | 10/1988 | Cronin | 427/96 |
| 4,838,992 | 6/1989 | Abraham | 156/643 |
| 4,889,589 | 12/1989 | McComas | 427/307 |
| 4,895,734 | 1/1990 | Yoshida | 427/99 |
| 4,951,601 | 8/1990 | Maydan et al. | 118/719 |
| 4,992,134 | 2/1991 | Gupta et al. | 437/937 |
| 5,030,319 | 7/1991 | Nishino et al. | 156/635 |

FOREIGN PATENT DOCUMENTS

| | | | |
|---|---|---|---|
| 0195977 | 10/1986 | European Pat. Off. . | |
| 1113760 | 5/1986 | Japan | 427/307 |

OTHER PUBLICATIONS

S. Wolf et al., *Silicon Processing for the VLSI Era*, vol. 1, Lattice Press, Sunset Beach, CA, 1986, pp. 400–404, 520, 559–564.

E. K. Broadbent, C. L. Ramiller "Selective Low Pressure Chemical Vapor Deposition of Tungsten" J. Electrochem. Soc. vol. 131, No. 6; Jun. 1984 pp. 1427–1933.

*Primary Examiner*—Chandra Chaudhari
*Attorney, Agent, or Firm*—Fay, Sharpe, Beall, Fagan, Minnich & McKee

[57] ABSTRACT

The present invention relates to a method for filling small via holes provided to insulating film on a wafer to expose parts of the underlayer of the wafer by metal by means of CVD, and an apparatus therefor. The gist of the present invention lies in that, before CVD is conducted, a surface cleaning treatment of small via hole bottom underlayer surface and a stabilization treatment of insulating film surface activated thereby are carried out successively or simultaneously and optionally an anti-corrosive treatment is applied to underlayer surface, and then the CVD treatment is conducted without exposing the underlayer metal subjected to above treatments to the air. The present invention provides an effect of enabling via filling by metal which shows good selectivity and gives a low interfacial resistance between underlayer metal and filled metal.

18 Claims, 16 Drawing Sheets

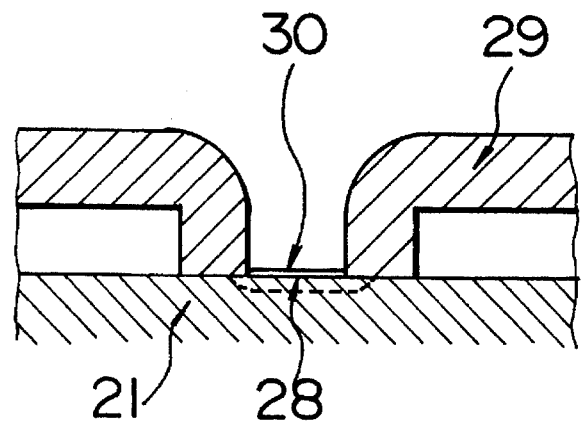
F I G. 11(a)
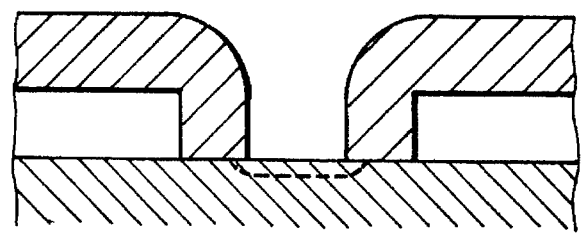
F I G. 11(b)
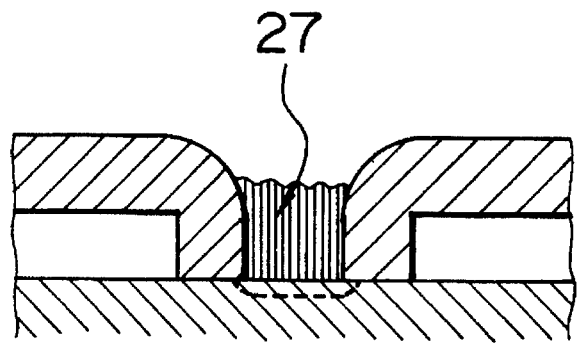
F I G. 11(c)

FIG. 12

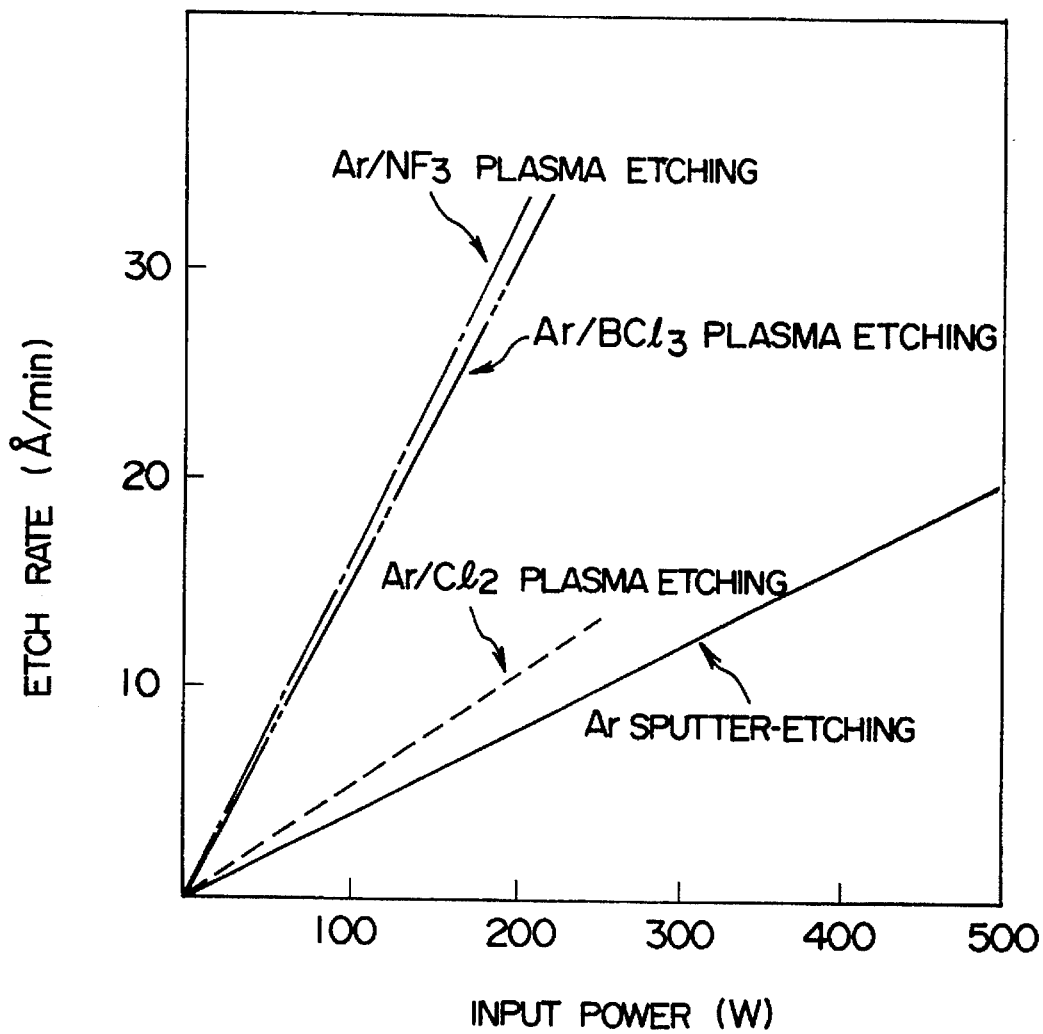

* ETCHING CONDITION
  ETCHED FILMS : EVAPORATED $Al_2O_3$
  Ar SPUTTER-ETCHING : FLOW RATE OF Ar = 100 sccm, PRESSURE = 10 mTorr
  Ar/$NF_3$ PLASMA ETCHING : FLOW RATE OF Ar = 100 sccm, FLOW RATE OF $NF_3$ = 5 sccm, PRESSURE = 10 mTorr
  Ar/$Cl_2$ PLASMA ETCHING : FLOW RATE OF Ar = 100 sccm, FLOW RATE OF $Cl_2$ = 9 sccm, PRESSURE = 10 mTorr
  Ar/$BCl_3$ PLASMA ETCHING : FLOW RATE OF Ar = 100 sccm, FLOW RATE OF $BCl_3$ = 3 sccm, PRESSURE = 10 mTorr F I G. 19
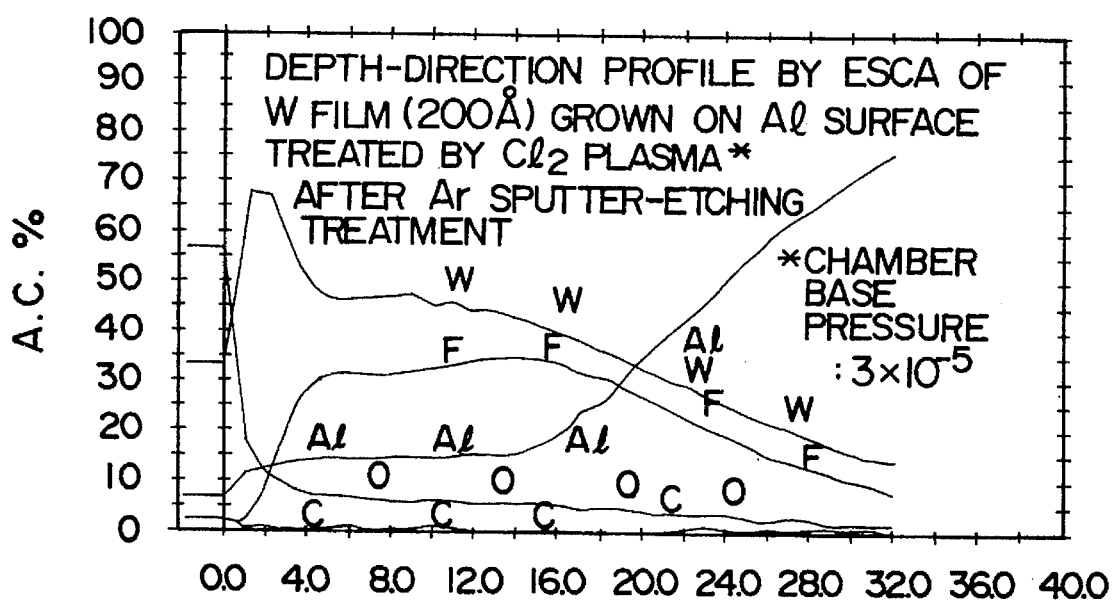

PROCESS FOR FORMING MULTILAYER WIRING

This is a continuation of application Ser. No. 742,447 filed on Aug. 5, 1991; now abandoned and, Ser. No. 384,735 filed on Jul. 24, 1989, now abandoned.

BACKGROUND OF THE INVENTION

The present invention relates to a method for filling small via holes provided to insulating film to expose parts of the underlayer on a wafer by metal by means of selective CVD (chemical vapor deposition) and an apparatus therefor. In particular, it relates to a method for via filling by metal suitable for filling small via holes by metal which is capable of both securing a satisfactory selectivity and providing a good low contact resistance, and to an apparatus therefor.

With the recent trend toward more highly integrated LSIs, difficulties in wiring design for connection between elements and wiring or between respective wirings are becoming more serious, and multilayer wiring, so called multilevel metallization, has become an indispensable technique for overcoming the difficulties. In order to connect a lower layer wiring and an upper layer wiring provided thereon with an insulating film provided therebetween, there is used a method which comprises providing minute via holes to the insulating film and filling the via holes by a metal. Several methods are known for filling via holes. Among them, one of the most promising methods for use in practice is selective CVD of a metal (particularly tungsten) because it shows a good via filling ability even when the diameter of via hole is very small.

The method of selective CVD of tungsten comprises introducing a mixture of tungsten fluoride ($WF_6$) gas and hydrogen ($H_2$) gas over a sample heated to above 250° C. and making them contact with each other, and thereby making a tungsten (W) film grow on the underlayer metal (exemplified herein by aluminum) based on either of the following reactions.

$$WF_6 + 2Al \rightarrow W + 2AlF_3 \qquad (1)$$

$$WF_6 + 3H_2 \rightarrow W + 6HF \qquad (2)$$

On an insulating film such as $SiO_2$ film, the reaction (1) does not take place and also the reaction (2) does not proceed at a temperature not higher than 700° C., so that tungsten grows selectively on aluminum, whereby via filling can be achieved.

References which give description of selective CVD of tungsten include J. Electrochem. Soc. 131, 1427–1433 (1984) and Proc. of VLSI Multilevel Interconnection Conference (Jun. 15–16, 1987) p 132–137. However, even when the methods described in above references are used, such insulating substances as oxide film present on Al underlayer and $AlF_3$ formed by the reaction (1) remain at the interface between tungsten and aluminum in the via hole, making it difficult to obtain a sufficiently low contact resistance at the via hole part. Methods which have been proposed to solve the above problem include one comprising forming the tungsten film while heating the wafer above 380° C. as disclosed in Proc. of VLSI Multilevel Interconnection Conference (Jun. 15–16, 1987) p. 208–215, and a method comprising attaching a thin (about 500 Å thick) $MoSi_2$ film onto aluminum and thereby inserting $MoSi_2$ between aluminum and tungsten, whereby the tungsten film can be formed without leaving aluminum surface oxide film and $AlF_3$ behind at the interface, as disclosed in Toshiba Review, Vol. 41, No. 12, p. 988–991.

Recently, a method has been reported in which $SiH_4$ or a similar gas is used in place of $H_2$ as a reducing gas, as described, for example, in Technical Digest IEDM (1987), P213–P219. The use of this method enables a high rate film growth at a wafer heating temperature as low as 250°–320° C. In this method, at a temperature not below 340° C., the selectivity is lost and selective via filling cannot be achieved.

In the prior techniques mentioned above, however, no sufficient consideration is given regarding the treatment of underlayer metal surface on which tungsten is to be grown by selective CVD, resulting in the following problems. That is, the contact resistance at the via hole is not-sufficiently low or, even when the contact resistance at the via hole is low, the resistance of wiring itself increases; or tungsten grows also on the insulating film as the result of surface cleaning treatment of via hole underlayers, leading to occurrence of short circuit between adjacent through holes.

The surface of underlayer metal after formation of small via holes is contaminated by fouling originated from a photoetching process applied for providing the small via holes, or the metal surface is formed of a oxide film ($Al_2O_3$ etc. when the underlayer metal is aluminum, for example) purposely provided as an anti-corrosive treatment against a halogen-containing gas used as an etching gas. Therefore, the underlayer has no clean metal surface exposed, and impurities which increase contact resistance remain at the interface between underlayer metal and tungsten even after tungsten film has been grown. The oxides etc. which remain at the interface are, when a wafer temperature of 380° C. or more is used in growth of tungsten, sometimes decreased in amount through the etching reaction of $WF_6$ and diffusion within film during heating, resulting in a sufficiently low contact resistance. However, when the underlayer surface conditions of small via holes differ from wafer to wafer, a sufficiently low contact resistance cannot always be obtained with good reproducibility. To solve the above problems, namely poor reproducibility of low contact resistance and increased contact resistance of the tungsten/aluminum interface formed by the selective CVD of tungsten mentioned above, there has been proposed a method which uses as an underlayer an aluminum of a laminate film formed by attaching a $MoSi_2$ film (about 500 Å thick) onto aluminum. In this method, since the remaining oxygen at the interface is decreased by making the exposed part of the small via hole constituted of $MoSi_2$ more difficultly oxidizable than aluminum and further since the formation of insulative $AlF_3$ with a low vapor pressure according to the above-mentioned equation (1) does not take place at the interface, the contact resistance of the $W/MoSi_2/Al$ is lower than that of the W/Al interface. However, this method is accompanied by a problem of requiring etching for forming a wiring of laminated film of $MoSi_2$ and Al and of increasing wiring resistance due to the use of $MoSi_2$ having a high resistivity. The above-mentioned increase in resistance poses no problem in the case of MOSLSI such as DRAM and SRAM because the film thickness of $MoSi_2$ is very thin as compared with that of aluminum. In the case of such LSIs as bipolar and biCMOS which capitalize on their high speed, however, even a slight increase in resistance raises a serious problem.

On the other hand, several methods have been tried in which aluminum is used as the underlayer and the via hole is filled by tungsten after cleaning the surface of the underlayer (including removal of $Al_2O_3$ on the aluminum surface). Methods used for cleaning the underlayer surface include a wet etching which uses a solution containing hydrogen fluoride (HF) or a compound thereof such as ammonium fluoride (NH$_4$F) and a sputter-etching which uses Ar ions. In the former treatment, however, a slight amount of fluorine remains even after washing and drying steps and causes the corrosion of aluminum underlayer. The latter sputter-etching treatment enables exposure of a clean underlayer surface since it physically removes the outer surface of the underlayer, and is hence in use as the method of pretreatment of underlayers in multilevel interconnection of sputtered aluminum. In this method, however, it has been revealed as described below that selectivity is lowered in the selective CVD, caused by the fact that the insulating film is sputter-etched simultaneously. When an insulating film is sputter-etched, the composition of the surface layer of insulator changes owing to the difference in sputtering yield between elements. In a SiO$_2$ film, for example, since O atom is more susceptible to sputtering than Si atom, the surface layer comes to have a composition rich in Si. In other words, active si atoms come to exist at the insulating film surface. This phenomenon has been studied by means of X-ray photoelectron spectroscopy (XPS or ESCA) and discussed, for example, in J. Vac. Sci. Technol., A 3(5) (1985), pp 1921–1928 and J. Phys. D: Applied Phys., 20 (1987), pp 1091–1094.

When the selective CVD of tungsten is carried out under such conditions, the growth of tungsten proceeds presumably as the result of the following reaction:

$$WF_6 3/2Si \rightarrow W + 3/2SiF_4 \qquad (3)$$

Accordingly, tungsten grows also on SiO$_2$, resulting in lowering of selectivity. This applies also to the selective CVD of other metals than tungsten. Thus, since selective CVD is based on the difference in chemical activity between respective surface parts, when a part at which no growth is desired, namely the surface of insulating film, is sputtered and activated, selectively is lowered resultantly. When a metal grows on insulating film, it gives rise to a possibility of short circuit with adjacent through holes and, further, since the metal film formed on the insulating film is apt to peel off, it remains as dirt on the wafer and causes the lowering of yield.

In the foregoing, description was made with reference to a via hole using an aluminum wiring as an underlayer because the surface oxide film on aluminum are generally known as the representative of the most difficultly removable materials. However, in case of via filling of a via hole with Si contact, which is called a contact hole occasionally, where doped Si, various barrier metals (e.g., WSi$_2$, MoSi$_2$, TiSi$_2$, PtSi, and TiW) are used as underlayer, there arise problems different from those in via holes using an aluminum wiring as an underlayer mentioned above. Tungsten film is formed relatively easily on the surface of the above-mentioned materials which may possibly constitute the underlayer of contact holes, because they do not form an oxide film so strongly as the aluminum does. However, in case that a number of different materials come to exist as the underlayer of the bottom part of holes, the growth rate of tungsten varies depending on the difference of materials of underlayer, leading to a situation wherein while via filling by tungsten has been completed in holes of a certain underlayer, the growth of tungsten has just begun at other holes. This is attributable to the differences in thickness, and/or quality of the oxide film present on the surface of underlayers caused by the difference in material of underlayers. It is generally considered that in W-CVD (tungsten chemical vapor deposition) the growth of tungsten does not begin simultaneously with the introduction of raw material gas, but an induction time is present after the introduction of gas till the substantial initiation of growth of tungsten, because the surface oxide film of the underlayer delays the initiation of tungsten film growth. Therefore, the presence of contact holes different in thickness and quality of the surface oxide film of underlayers on the same wafer leads to difficulty in obtaining uniform film thickness in via filling by tungsten. Thus, it is necessary to remove these surface oxide films of underlayer in order to obtain a uniform film thickness of via filling by tungsten in contact holes. In doped Si and various silicides used as the underlayer material of contact holes, wet etching treatment with a solution containing hydrogen fluoride or a compound thereof such as ammonium fluoride is carried out as a means for cleaning the underlayer surface and the surface oxide film is removed thereby because no problem of corrosion arises unlike in aluminum. However, even in a wafer subjected to such wet etching treatment, there remains a problem unsolved in that a surface oxide film is formed during drying wafers or during the time preceding the transport to a CVD apparatus, resulting in not uniform film thickness in via filling by tungsten. On the other hand, when the sputter-etching of a surface oxide film of the underlayers and the growth of tungsten film are carried out continuously, no oxide film is formed on the underlayer surface of the contact hole bottom before tungsten film growth but, as described above with reference to via holes on aluminum wiring, there arises the problem of decreased selectivity.

SUMMARY OF THE INVENTION

The object of the present invention is to provide, in filling a small via hole by metal by means of CVD typically represented by tungsten selective CVD, a method in which selectivity is not lowered even when a treatment for cleaning small via hole underlayer surfaces is carried out, and an apparatus therefor.

The above object can be attained, in via filling of via holes or contact holes by CVD of tungsten, by successively conducting the following three treatments:

1-(1) a surface cleaning treatment of small via hole bottom underlayer surface (removing treatment of surface oxide layer etc.), 1-(2) a stabilization treatment of the insulating film surface layer activated by said surface cleaning treatment, and 1-(3) a treatment of filling small via holes by metal by means of CVD of tungsten using WF$_6$ gas and reducing gas (H$_2$, silane (SiH$_4$) and like compounds used alone or as a gas mixture); or by conducting the above treatments (1) and (2) simultaneously and then conducting the third treatment, in other words conducting the following two treatments successively:

2-(1) a surface cleaning treatment of small via hole bottom underlayer accompanied by no activation of the surface of insulating film on the wafer (namely, removing treatment of surface oxide layer etc.), and 2-(2) a treatment of filling small via holes by metal by means of CVD of tungsten using WF$_6$ gas and reducing gas (H$_2$, silane (SiH$_4$) and like compounds used alone or as a gas mixture); or, since substances corrosive to underlayer produced by surface cleaning treatment sometimes remain on wafers depending on the combination of the material of small via hole underlayer with the kind of halogen gas used for the cleaning treatment, by carrying out the following three treatments successively:

3-(1) a surface cleaning treatment of small via hole bottom underlayer surface accompanied by no activation of the surface of insulating film on the wafer (namely, removing treatment of surface oxide layer etc.), 3-(2) a treatment of removing substances corrosive to small via hole bottom underlayer produced by the above surface cleaning treatment (namely, anti-corrosive treatment), and 3-(3) a treatment of filling small via holes by metal by means of CVD of tungsten using $WF_6$ gas and reducing gas ($H_2$, silane, and like compound used alone or as a gas mixture).

Among the above-mentioned treatments, with respect to the treatment 1-(1), sputter-etching treatment using inert gases such as Ar may be used. Respecting the stabilization treatment of 1-(2), the insulating film surface which has become rich in Si and active can be modified by plasma treatment using halogen-containing chemical etching gases such as $Cl_2$, $BCl_3$, $CCl_4$, $C_2Cl_4$, $SiCl_4$, $NF_3$, $SF_6$ and $SiF_4$ each alone or as a mixture thereof with inert gases such as Ar.

The stabilization treatment of 1-(2) may also be effected by another method comprising heating a wafer in $N_2$ (a pure gas or a mixture containing a very small amount of $O_2$) atmosphere.

With respect to the treatment 2-(1) wherein said (1) and 1-(2) are carried out simultaneously, the surface oxide film of small via hole bottom underlayer can be removed, with no accompanying activation of the insulating film surface, by plasma treatment using halogen-containing chemical etching gases employed in the above stabilization treatment of 1-(2) such as $Cl_2$, $BCl_3$, $CCl_4$, $C_2Cl_4$, $SiCl_4$, $NF_3$, $CF_4$, $CHF_3$, $SF_6$ and $SiF_4$ each alone or as a mixture thereof with inert gases such as Ar.

The etch amount necessary in said simultaneous treatments is just to correspond to the amount of sputter-etching applied in 1-(1), whereas only a slight modification of surface layer is effected in the stabilization treatment of 1-(2) described before. When sputter-etching by Ar ions is effected by using plasma of Ar gas alone as in the prior art, the surface layer of insulating film becomes rich in Si and is activated owing to the difference in sputtering yield among elements as described before, whereas in the case where halogen gas plasma is used, even when the surface layer becomes partly rich in Si, the Si-rich part is immediately removed by halogen ions or radicals and the insulating film surface is ultimately not activated; rather, selectivity in tungsten film growth is improved as compared with a case where no such treatment is applied because active parts rich in Si originating from defect etc. developed in forming the insulation film are removed. However, depending on the combination of the material of small via hole bottom underlayer with the kind of halogen gas used for the surface cleaning treatment, there sometimes remain on wafers substances corrosive to underlayer produced by the surface cleaning treatment. That is, when the underlayer of small via hole bottom part is aluminum wiring and a halogen gas containing chlorine is used, there will remain such substances as $AlCl_3$ which will react with moisture contained in the air and corrode aluminum wiring when the wafer is taken out into the air after tungsten film growth. In such a case, therefore, a treatment of removing residual chlorine is necessary as an anti-corrosive treatment after the surface cleaning treatment.

The removal of substances corrosive to small via hole bottom underlayers as an anti-corrosive treatment can be effected by oxygen plasma treatment or fluorine plasma treatment, to knock out the corrosive substances remaining on the wafer with ions or radicals or to form a thin protective film on the underlayer surface. A heat treatment is also effective as an anti-corrosive treatment which comprises heating the wafer thereby to evaporate off remaining corrosive substances.

The selective tungsten CVD treatment of 1-(2), 2-(2) or 3-(3) can be accomplished by using one-stage CVD which comprises passing a gas mixture of $WF_6$ and a reducing gas such as $H_2$, $SiH_4$ etc. over a heated wafer in a CVD reaction chamber set up for conducting selective CVD, by using a two-stage CVD which comprises passing $WF_6$, alone or diluted with inert gases such as Ar, and then passing $WF_6$ and the above-mentioned reducing gas over a heated wafer, or by using a CVD of two or more stages which comprises passing $WF_6$ and $H_2$ and then passing $WF_6$ and another reducing gas. Reducing gases which can be used are, for example, $H_2$, $SiH_4$, $Si_2H_6$, $BH_3$, $PH_3$ etc. used alone or in a combination thereof.

In the plasma treatment apparatus using chemical etching gas used in the present invention, plasma is generated by high frequency wave (of preferably 10 kHz or more) as in conventional methods. However, if the wall etc. of the treatment chamber is sputtered by generated plasma and metallic contaminants adhere onto the wafer, tungsten will grow from the contaminants serving as nuclei in the subsequent W-CVD, which may result in lowering of selectivity. Therefore, it is important for exhibiting the effect of the present invention that a cathode coupled type apparatus wherein the wafer is negatively charged when high frequency wave is applied to the electrode through a blocking capacitance be used as the plasma treatment apparatus and the apparatus be constructed such that parts which are close to the wafer surface and may possibly become the source of metallic contaminants are covered by quartz plates.

The above-mentioned surface cleaning treatment of small via hole bottom underlayers has an effect of removing by a physical treatment of sputter-etching oxide films present on the underlayer surface and organic residues left behind in preceding processes for small via hole formation including etching process and resist-removing process, and thereby cleaning the underlayer surface and lowering the contact resistance at the small via hole bottom part. On the other hand, the stabilization treatment of insulating film layer has an effect of preferentially removing by plasma of halogen-containing gas the activated parts including Si radical etc. of insulating film surface layer produced by the above treatment and thereby preventing the growth of tungsten on insulating film in succeeding selective CVD.

The surface cleaning effect and the effect of stabilizing insulating film surfaces mentioned above have been confirmed by the following experimental results. Samples shown in Table 1 were prepared and examined for $SiO_2$ surface activation by Ar sputter-etching and for surface stabilization effect by $Cl_2$ plasma with an X-ray photoelectron spectroscopy (ESCA or XPS) apparatus. First, the content ratio of O to Si (O/Si) at the surface was determined. The results are shown in Table 2, which all show a value larger than 2 (namely, the surface is richer in O than in $SiO_2$). This is because since the samples were exposed to the air before analysis, the surfaces contain adsorbed $O_2$. As is apparent from Table 2, in Ar sputtering, O gives a higher sputtering efficiency than Si and resultantly the surface of the sample (#2) treated by Ar sputter-etching is richer in Si than that of the untreated sample (#1). In $Cl_2$ plasma treatment, on the other hand, presumably $Cl^+$ (or radicals of Cl atom etc.) attacks Si first and, in consequence, the surface of the sample (#3) treated by $Cl_2$ plasma is richer in O than that of the untreated sample. For further verification, spectra of $Si_{2p}$ peak were determined at an X-ray incident angle on the $SiO_2$ surface of 30° and 90°. These are shown in FIGS. 13 to 15. The smaller the incident angle of X-ray is, information on parts closer to surface layer can be obtained. Further, when stable Si-O bonds are severed and unbonded Si and Si-Si bonds are formed, the peak undergoes a chemical shift toward lower energy side. In the untreated $SiO_2$ surface the peaks at 30°, and 90° coincide entirely with each other, whereas in Ar-sputtered surface the peak at 30° which represents a part closer to surface layer, shifts toward lower energy side and becomes broad. On the other hand, in a sample treated additionally by $Cl_2$ plasma the peak shows almost no change as in the untreated sample, which is attributable to removal of unbonded Si and Si-Si bonds formed by Ar sputtering. The peaks at 30° representing a part closer to surface layer were compared for above samples and shown in FIG. 16, which demonstrates the stabilization effect exhibited by $Cl_2$ plasma treatment. On more detailed inspection, the peak in the $Cl_2$ plasma-treated sample somewhat shifts as compared with that in the untreated sample. This is attributable, when the data on O/Si content ratio is taken into consideration, to chemical shift caused by unbonded O or O-O bonds formed. Further, to examine the effect of the pretreatment according to the present invention on an aluminum surface, profiles by ESCA in the direction of depth at the tungsten/aluminum interface were also determined. Depth-direction profiles obtained with samples shown in Table 1 are shown in FIGS. 17 and 18. To examine halogens (F and Cl) present at the interface with good sensitivity, growth of tungsten was conducted at a temperature (370° C.) lower than that (450° C.) used in practical processes. The amount of Cl remaining at the tungsten/aluminum interface was found to be less than detection sensitivity even after $Cl_2$ plasma treatment. Further, it was confirmed that the amount of O remaining at the tungsten/aluminum interface had been reduced by Ar sputter-etching. Just like as the effect of stabilizing a $SiO_2$ surface was shown above for the case of using $Cl_2$ plasma, the effect of stabilizing a $SiO_2$ surface was obtained in exactly the same manner for the case of using $NF_3$ plasma. Also, in heating a wafer in $N_2$ atmosphere, the effect of stabilizing a $SiO_2$ surface was confirmed by ESCA. However, since it cannot be expected that unbonded Si or Si-Si bonds are removed with $N_2$ and since no Si-N bond was detected, it is presumed that either a trace amount of $O_2$ contained in $N_2$ had oxidized Si or Si-Si bonds or even when they had changed into Si-N bonds their amount were below detection sensitivity. Though a $N_2$ gas of a purity of 5N or more was used, there is a possibility of leakage of $O_2$ from piping, so that it cannot be judged which of the above two presumptions represents the fact.

In the foregoing, description was made of action and effect in a method wherein surface cleaning treatment and stabilization treatment are conducted successively. However, since a halogen-containing gas plasma alone exerts itself a physical sputter-etching action, the stabilization treatment and the surface cleaning treatment may also be conducted simultaneously. In this case, physical etching effect (namely, surface cleaning effect) can be enhanced by incorporation of inert gases such as Ar. Even when the plasma is formed from a gas mixture consisting of a large excess of an inert gas and a slight amount of halogen-containing gas, energy transfer occurs through collision with gases and ions in the plasma and hence chemical etching effect is not lost, so that physical surface cleaning action and stabilizing action on insulating film proceed simultaneously.

The above-mentioned surface cleaning effect was confirmed by the following experimental results. Samples were prepared by forming $Al_2O_3$ (alumina) film on Si wafers by electron beam vapor deposition. The resulting samples were treated by plasma of various gases and the film thickness of $Al_2O_3$ before and after the plasma treatment were determined with an ellipsometer, to examine the etch rate in various gas plasma treatments. The results thus obtained are shown in FIG. 12. When Ar sputtering, which uses a plasma of Ar gas alone, and a plasma treatment using gas mixture comprising Ar gas and a small amount of $NF_3$, $Cl_2$ or $BCl_3$ gas incorporated therein are compared, the etch rate in the latter plasma of gas mixture is higher than in the plasma of Ar gas alone even at the same pressure. This is attributable to the combination of physical effect with additional chemical effect. Particularly in plasma using Ar/$NF_3$ gas mixture containing $NF_3$ incorporated therein and plasma using Ar/$BCl_3$ gas mixture containing $BCl_3$ incorporated therein, the etch rate is as high as about 6 times that in Ar sputter-etching, revealing that chemical etching effect is playing a predominant role.

Since the underlayer material of small via hole bottom parts is Al wiring (sometimes containing a small amount of Si, Cu etc.), the use of chlorine-containing gas in surface cleaning treatment will leave such substances as $AlCl_3$ behind which will react with the moisture contained in air and corrode the aluminum wiring when a wafer is taken out into the air after growth of tungsten film. In such a case, the treatment of removing substances corrosive to small via hole bottom underlayers (namely, anticorrosive treatment) is desirably introduced to remove the above corrosive substances before the wafer is taken out into the air and thereby to prevent corrosion from occurring even when the wafer is taken out into the air. Since corrosion of small via hole bottom underlayers may cause breaking of wire to lower the reliability of products, prevention of corrosion is of great importance in some cases.

Subsequently to the pretreatments described above, selective CVD using $WF_6$ and a reducing gas such as $H_2$, $SiH_4$ etc. is carried out, whereby tungsten grows only on the small via hole bottom underlayers through a reaction with the underlayer or with the reducing gases, while no tungsten grows on insulating film. Thus, selective CVD process exerts an action of filling only small via holes by tungsten and thereby leveling the parts. The "underlayer" of small via holes in the present invention refers to all those underlayers which directly react with $WF_6$ or on which reducing gases are adsorbed and dissociated to reduce $WF_6$, including wiring layers comprising aluminum or mainly aluminum, doped or not doped Si layers, and barrier layers of $MoSi_2$, $WSi_2$, $TiSi_2$, PtSi, TiW, TiN, W, Mo and the like. The "insulating film" refers to all the insulating films used in LSI including inorganic insulating films such as thermally oxidized film, thermally nitrided film, PSG, BPSG, plasma-oxidized film and plasma-nitrided film, and organic insulating films such as SOG and PIQ.

BRIEF DESCRIPTION OF THE DRAWINGS

FIGS. 9–11 are partially enlarged sectional views respectively showing a process of filling a via hole or a contact hole by tungsten according to the method of the present invention. FIG. 12 is a graph obtained by plotting the etch rate of $Al_2O_3$ film in Ar sputter-etching and plasma treatment using a gas mixture of $Ar/NF_3$, $Ar/Cl_2$ or $Ar/BCl_3$ against power input to plasma. FIGS. 17–19 are respectively a graph showing a depth-direction profile obtained when a tungsten film formed on an aluminum film subjected to no treatment or sputter-etching treatment plus $Cl_2$ plasma treatment (under two conditions) is analyzed by ESCA.

DETAILED DESCRIPTION OF THE PREFERRED EMBODIMENTS

Some preferred embodiments of the present invention, classified into 5 cases, will be described below with reference to drawings. First, embodiments wherein, among the methods of selective filling of via holes by tungsten according to the present invention, Ar sputter-etching is conducted as a pretreatment and then a stabilization treatment of insulating film surface was carried out by using plasma of a halogen-containing gas are shown as Examples 1-1 to 1-6. Nextly, an embodiment wherein a stabilization treatment of insulating film surface succeeding to sputter-etching is effected by a heat treatment in nitrogen (pure nitrogen gas or nitrogen containing a slight amount of oxygen) at atmospheric pressure is shown as Example 2. Then, among embodiments wherein a plasma etching treatment using a gas mixture of Ar and a halogen-containing gas is conducted as a pretreatment, one wherein a fluorine-containing gas is used as a halogen gas is shown as Example 3 and embodiments wherein a chlorine-containing gas is used as a halogen gas and an anticorrosive treatment is conducted in addition are shown as Examples 4-1 and 4-2. Finally, an embodiment wherein, in selective filling of contact holes by tungsten, a plasma etching treatment using a gas mixture of Ar and a halogen-containing gas is conducted as a pretreatment is shown as Example 5.

EXAMPLE 1-1

Figure 1:
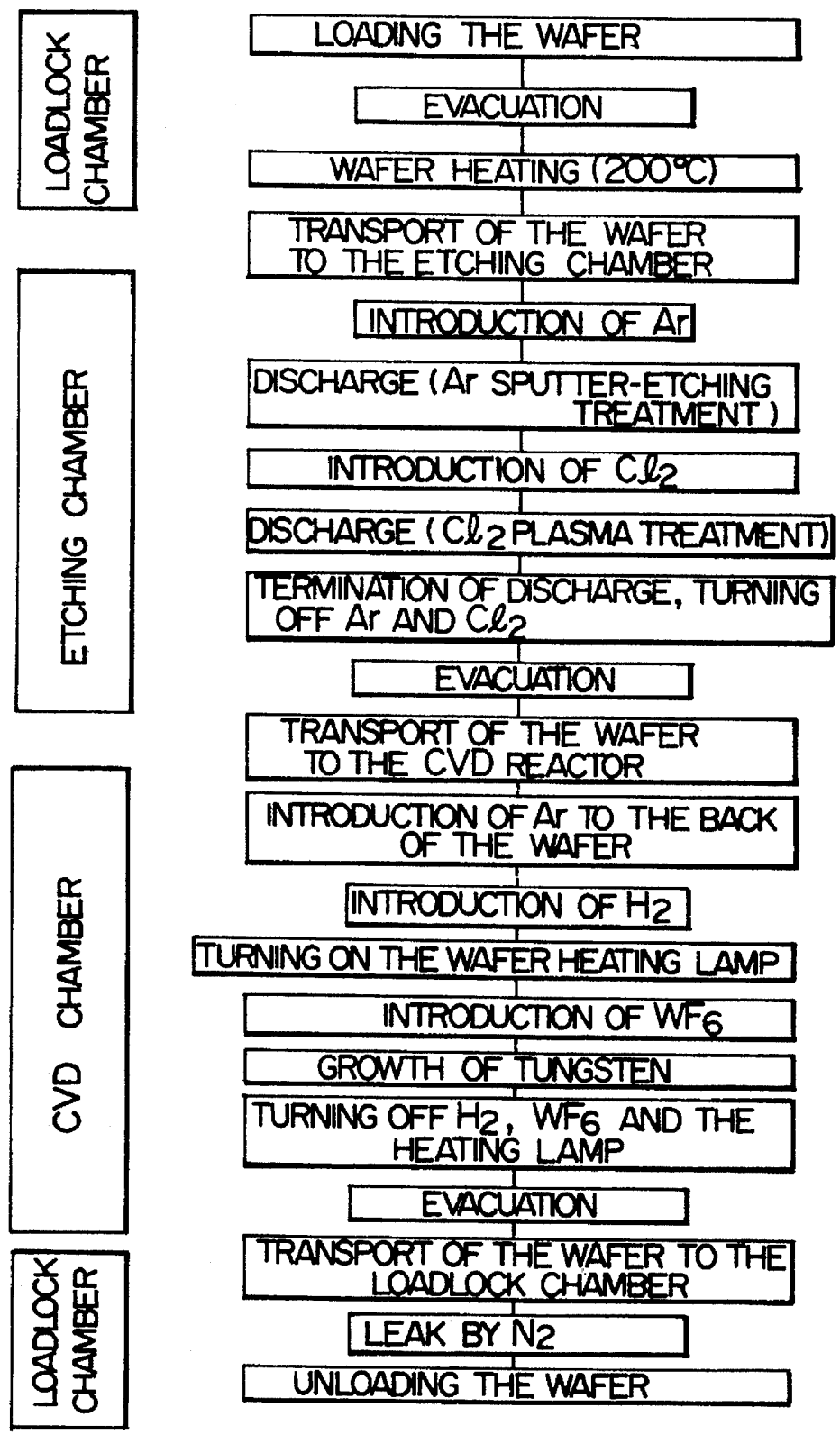
FIG. 1 is a diagram showing, among the methods of filling via holes by metal according to the present invention, a process flow wherein Ar sputter-etching is carried out as a pretreatment and then a stabilization treatment of insulating film surface by $Cl_2$ plasma is conducted.
Figure 8:
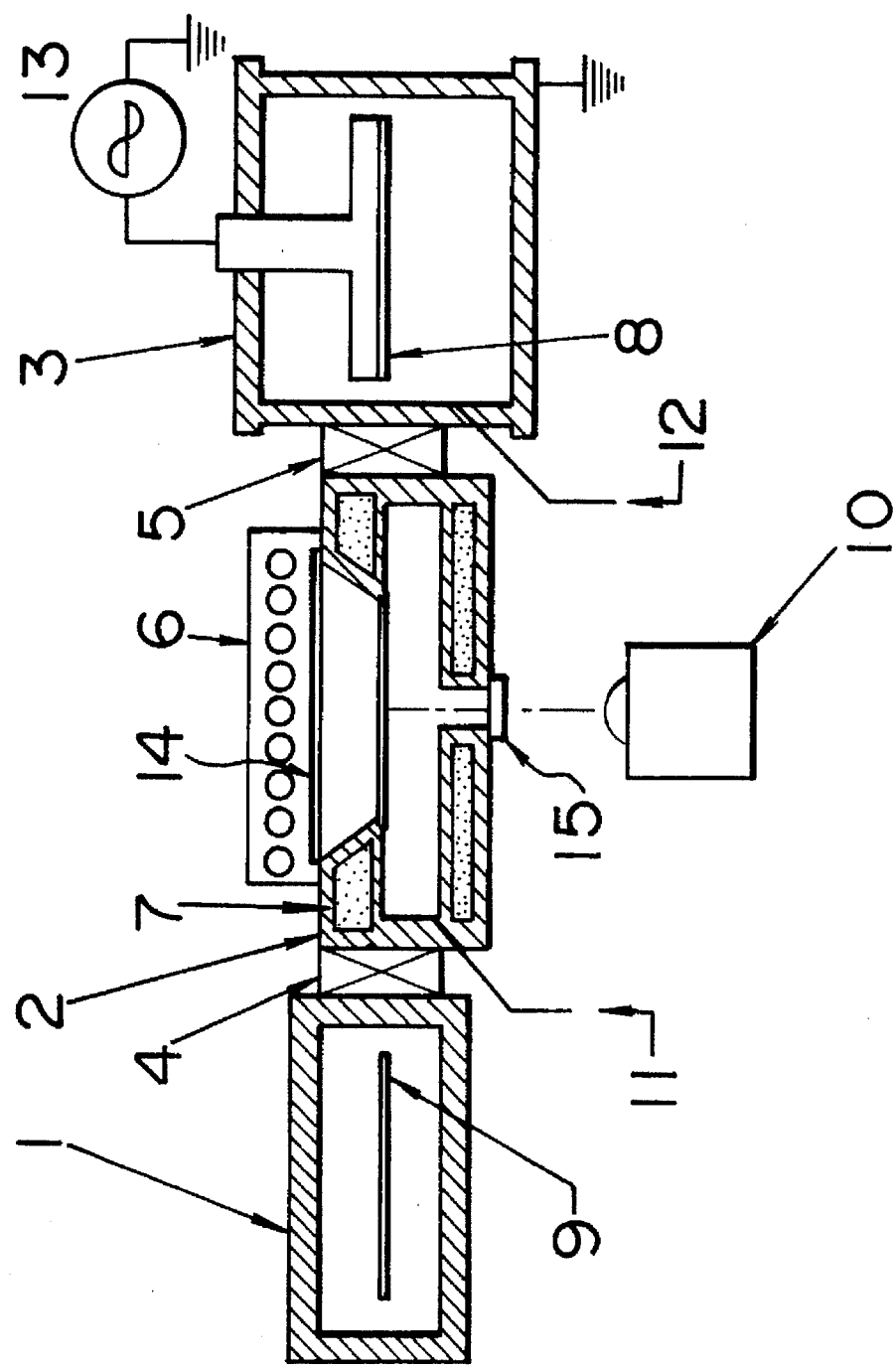
FIG. 8 is a diagram showing the overall structure of a selective CVD apparatus for via filling by metal used in the present invention.
Figure 9A:
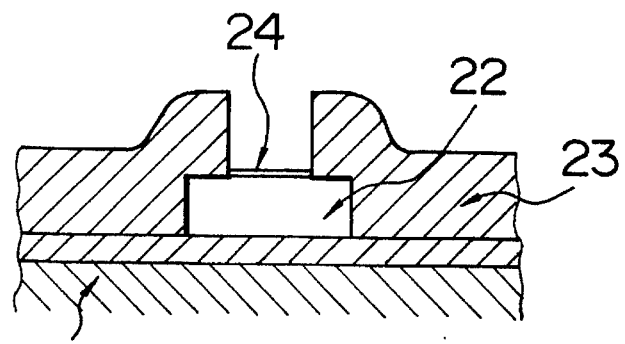
Figure 9B:
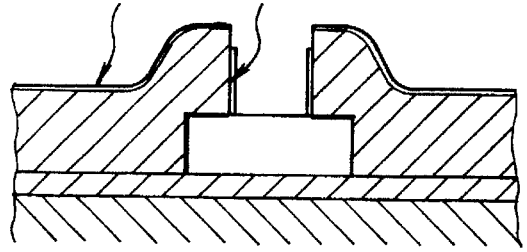
Figure 9C:
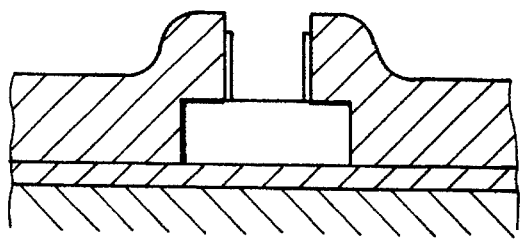
Figure 9D:
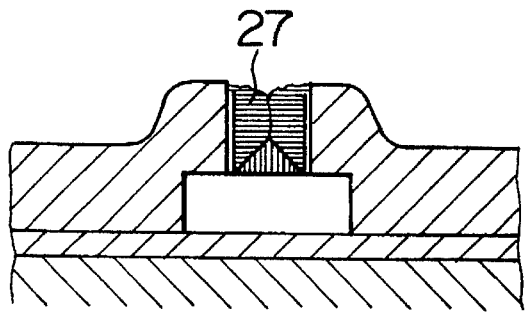

FIG. 1 is a diagram showing, among the methods of filling a via hole by tungsten according to the present invention, a process flow wherein Ar sputter-etching is carried out as a pretreatment and then a stabilization treatment of insulating film surface by $Cl_2$ plasma is conducted. FIG. 8 shows a selective CVD apparatus for via filling by metal used in the present invention. The present Example will be described by way of FIG. 1 with concurrent reference to FIG. 8.

A wafer 9 was loaded in a loadlock chamber 1 shown in FIG. 8 and then the loadlock chamber 1 was evacuated to about $10^{-5}$ Torr. Thereafter, the wafer 9 was heated to about 200° C. with a heating lamp (not shown in the Figure) provided in the chamber, to burn off moisture attaching to the wafer 9. After confirming the stop of pressure increase in the loadlock chamber 1 due to burning off of moisture from the wafer 9 during the heating (the stop occurred after the lapse of about two minutes), the heating was stopped, gate valves 4 and 5 were opened, and the wafer 9 was transported through a wafer transport mechanism (not shown in the Figure) into an etching chamber 3 and placed therein. The etching chamber 3 was evacuated beforehand to about $10^{-7}$ Torr by means of a cryopump. In order that oxidation in sputter-etching may be prevented from occurring, the leak rate of the etching chamber 3 needs to be suppressed to below $10^{-5}$ Torr·l/sec. The lower the leak rate value is the more desirable. The etching chamber 3 is so constructed that, to prevent metallic contaminants, which might come from the inner wall of the etching chamber 3 and an electrode 8, from adhering to the wafer 9, the wafer side electrode 8 is of a cathode coupled type and a bias of negative potential is applied to the wafer side during discharge, whereby sputtering of the inner wall of etching chamber 3 by ions during discharge may be kept to minimum and only the wafer 9 placed on the cathode electrode 8 side may be sputtered by ions. The cathode electrode 8 is provided with a quartz cover (not shown in the Figure) to suppress as much as possible metallic contamination from the exposed part of electrode 8 at the periphery of the wafer 9.

The pressure in the etching chamber 3 increased somewhat when the gate valve 5 was opened in company with the transport of the wafer 9 into the etching chamber 3 but recovered in a moment when the gate valve 5 was opened after the wafer 9 had been placed. After confirming the pressure recovery, Ar gas was introduced into the etching chamber 3. Then, a high frequency power was applied by a high frequency power source 13 to the cathode electrode 8 in the etching chamber 3 to start discharge and to produce Ar plasma. After a predetermined time of discharge, application of high frequency power was once stopped, then $Cl_2$ gas was introduced and discharge was started again to generate $Cl_2$ plasma. After a predetermined time of discharge, introduction of Ar gas and $Cl_2$ gas and application of high frequency power are stopped and discharge was stopped. After confirming that the pressure in the etching chamber 3 had recovered again to about $10^{-7}$ Torr, the gate valve 5 was opened and the wafer 9 was transported through a wafer transport mechanism (not shown in the Figure) into a CVD reactor 2 evacuated to a pressure below $10^{-5}$ Torr beforehand. After the wafer 9 was transported into and placed in the CVD reactor 2, the gate valve 5 was closed, Ar was introduced to the back of the wafer 9, the gate valve 4 was closed simultaneously with beginning of gradual increase of the pressure in the CVD reactor 2, and $H_2$ gas was introduced into the CVD reactor 2. In the CVD reactor 2, the wafer 9 was irradiated by infrared rays with a halogen lamp 6 for heating the wafer through a quartz window 14 and was heated to a predetermined temperature. The power of the wafer heating halogen lamp 6 is controlled with a thermocouple 7 provided between the quartz window 14 and the back of the wafer 9 and with a pyrometer 10 so provided as to be able to measure the temperature of wafer 9 by monitoring the infrared rays radiated from the surface of wafer 9 through a calcium fluoride (CaF$_2$) window 15. The inner wall of the CVD reactor 2 is cooled with water, whereby the temperature of the inner wall of the CVD reactor 2 excepting the surface of the wafer 9 is decreased to a sufficiently low temperature (about 120° C. or below) at which substantially no growth of tungsten film proceeds even at the time of heating the wafer 9. After the wafer 9 was heated to a predetermined temperature, WF$_6$ was introduced in addition to H$_2$ to effect selective growth of tungsten. After the tungsten film was grown to a predetermined thickness, introduction of H$_2$ and WF$_6$ was stopped, and simultaneously therewith the wafer heating lamp 6 was turned off and the CVD reactor was evacuated. The gate valve 4 was opened and the wafer 9 was transported to the loadlock chamber 1. The gate valve 4 was closed, N$_2$ was introduced, the wafer was cooled simultaneously therewith and, after the internal pressure of the loadlock chamber 1 reached to atmospheric pressure, the wafer 9 was taken out. Thus, via filling by tungsten was completed.

An example of the treatment conditions in the above-described process is shown in the column of Example 1-1 of Table 3 together with those for other Examples. The wafer used is a test wafer prepared by forming SiO$_2$ film 23 on a Si wafer 21 upon an underlayer aluminum wiring 22 by means of plasma CVD etc. and then forming a large number of small via holes of 1 μm square (1.2 μm in depth) by photoetching. FIG. 9 (a) shows an enlarged sectional view of the small via hole of the wafer not yet subjected to the treatments shown in FIG. 1. In FIG. 9 (a), 21 indicates a Si wafer, 22 underlayer aluminum wiring, 23 plasma CVD SiO$_2$ film, and 24 surface oxide film on aluminum wiring at the opening part. FIG. 9 (b) shows a sectional view of a via hole after subjected to Ar sputter-etching treatment. In FIG. 9 (b), the aluminum surface oxide film 24 seen in FIG. 9 (a) has been removed, and a thin aluminum film 25 adhered by resputtering from hole bottom by Ar is observed on the via hole side wall. As described before, at the SiO$_2$ surface there exists a surface layer 26 rich in Si containing free radicals of Si activated by Ar sputtering or Si-Si bonds. FIG. 9 (c) shows a sectional view of a via hole subjected to Cl$_2$ plasma treatment. In FIG. 9 (c), the activated layer 26 of SiO$_2$ surface observed in FIG. 9 (b) has been removed. FIG. 9 (d) shows a sectional view of a via hole subjected to via filling treatment by tungsten. In FIG. 9 (d), tungsten film 27 has grown directly on aluminum wiring 22 and the via hole has been filled by tungsten. During this time, tungsten film grows, with aluminum serving as nuclei, simultaneously at the hole bottom part and at the side wall part, so that via filling by tungsten is completed at a thickness of grown tungsten film of about 0.5 μm for a via hole of 1 μm square section.

Then the wafer subjected to via filling treatment by tungsten film according to the present invention was evaluated for selectivity and contact resistance at the via hole part. The results of evaluation are shown in Table 4 together with those in other Examples and Comparative Examples described later. For evaluation of selectivity, a wafer 9 after via filling by 1 μm thick tungsten was observed in dark field with a metallographic microscope at a magnification of 2000, and the number of tungsten particles formed on a certain region of insulating (SiO$_2$) film was counted and expressed in terms of number of particles per unit area (herein 1 cm$^2$). In the test wafer used are formed via holes at a density of about two millions/cm$^2$. Thus, when 100 tungsten particles are present per cm$^2$ on SiO$_2$, for example, on a region of SiO$_2$ in which 20,000 through holes are present there exists one tungsten particle on the average. The criteria for selectivity were classified from the above viewpoint into ⊙ (50 particles/cm$^2$) to xx (growth of tungsten over the whole surface). In the present Example, the selectivity was excellent. For evaluation of contact resistance, when an upper layer aluminum wiring is formed after via filling by tungsten of the above-mentioned test wafer has been finished, the series resistance of a continuous chain of 4000–200,000 via holes can be measured; aluminum wiring resistance portion was subtracted from the measured resistance and the balance was divided by the number of through holes, the resulting value being taken as the contact resistance at the tungsten/aluminum interface. In the present Example, the contact resistance showed a very good value of 0.10–0.15 Ω/μm$^\square$. The value showed scarcely any change after a treatment at 475° C. for 90 minutes.

EXAMPLE 1-2

The same apparatus and the same wafer as in Example 1-1 were used and a continuous treatment of sputter-etching and Cl$_2$ plasma treatment was carried out. Then the wafer was once taken out into the air, and tungsten film growth treatment and subsequent treatments were conducted under the same conditions as in Example 1-1 (reference is made to the column of Example 1-2 in Table 3). The present Example was conducted with the aim of comparing a case wherein continuous treatment was conducted through the aid of transport in high vacuum (10$^{-5}$ Torr or less) and a case wherein such transport was not conducted. As shown in Example 1-2 of Table 4, the selectivity in the present Example was very good and at exactly the same level as in Example 1-1, but, regarding contact resistance evaluation, the contact resistance at the tungsten/aluminum interface was about 3 times as high as that in Example 1-1. Further, the time required for growth of tungsten in filling 1 μm depth was somewhat longer than in Example 1-1. This is presumably because when the wafer was once taken out into the air, naturally oxidized film was formed on the aluminum surface exposed at the via hole bottom. Thus, it is surmised that the increase in interfacial resistance is due to increase in oxygen remaining at the interface, and the longer time required for tungsten film growth is due to a longer nuclei formation time at the initial stage of tungsten film growth. The above results show that, from the viewpoint of contact resistance characteristic, continuous treatment as in Example 1 is more preferable. However, it is needless to say that for LSIs wherein specification requirements are not so severe as in bipolar LSIs, e.g. for LSIs of MOS type, the pretreatment method according to the present invention gives a sufficient effect in improving selectivity even when the pretreatment and the selective CVD are conducted discontinuously as in the present Example.

Nextly, three Comparative Examples will be described below to confirm in more detail the effects shown in Examples 1-1 and 1-2.

COMPARATIVE EXAMPLE 1-1

The same apparatus and wafer as used in Example 1-1 was employed. The wafer was loaded in the loadlock chamber 1, which was then evacuated, then the wafer was heated and thereafter transported directly to the CVD reactor 2 and, without pretreatment, subjected to tungsten film growth treatment and subsequent treatments under the same conditions as in Example 1-1 (reference is made to Table 3). This Example was conducted with the aim of confirming the effect of Ar sputtering pretreatment. Resultantly, it was found that the selectivity was somewhat lower than in Example 1-1 and the contact resistance was about two orders of magnitude or more higher than that in Example 1-1. Further, the time required for growth of tungsten in filling 1 μm depth was twice or more as long as that in Example 1-1 (reference is made to Table 4). As the reason for somewhat inferior selectivity in the present Comparative Example to that in Example 1, it is surmised that metallic contaminants formed on insulating film during via hole formation (photoetching, resist removal step, etc.) still remain though in a small extent, or during insulating film (plasma CVD $SiO_2$ film) formation free radicals of Si or Si-Si bonds have been already formed on the $SiO_2$ surface though in a small amount. In any way, it was confirmed that even when such active parts exist from the beginning on the surface of testing wafers used, the stabilization treatment by $Cl_2$ plasma mentioned above was effective also for said active parts. With respect to contact resistance and film growth time, it is considered that surface oxide film present on the aluminum surface is responsible as described above. However, whereas a low contact resistance (0.3–0.7 $\Omega/\mu m^{\square}$) was obtained at a tungsten growth temperature of 380° C. or more in a publicly known example mentioned before, a very high contact resistance was exhibited in the present Comparative Example although tungsten film growth was conducted at 450° C. This is presumably because the preparation process of the test wafer used in the present Comparative Example (also in the other Examples) involves a step of forming aluminum surface oxide film by $O_2$ plasma at the final stage of etching step of through hole formation in order to suppress the corrosion of aluminum wiring. That is, it is considered that whereas a fairly low contact resistance can be obtained in the case of naturally oxidized film on the aluminum surface formed in mere atmospheric air as shown before in Example 1-2, the aluminum surface oxide film formed by $O_2$ plasma is, in respect of both film thickness and film quality, stronger and more difficult to remove than naturally oxidized film.

COMPARATIVE EXAMPLE 1-2

Figure 7:
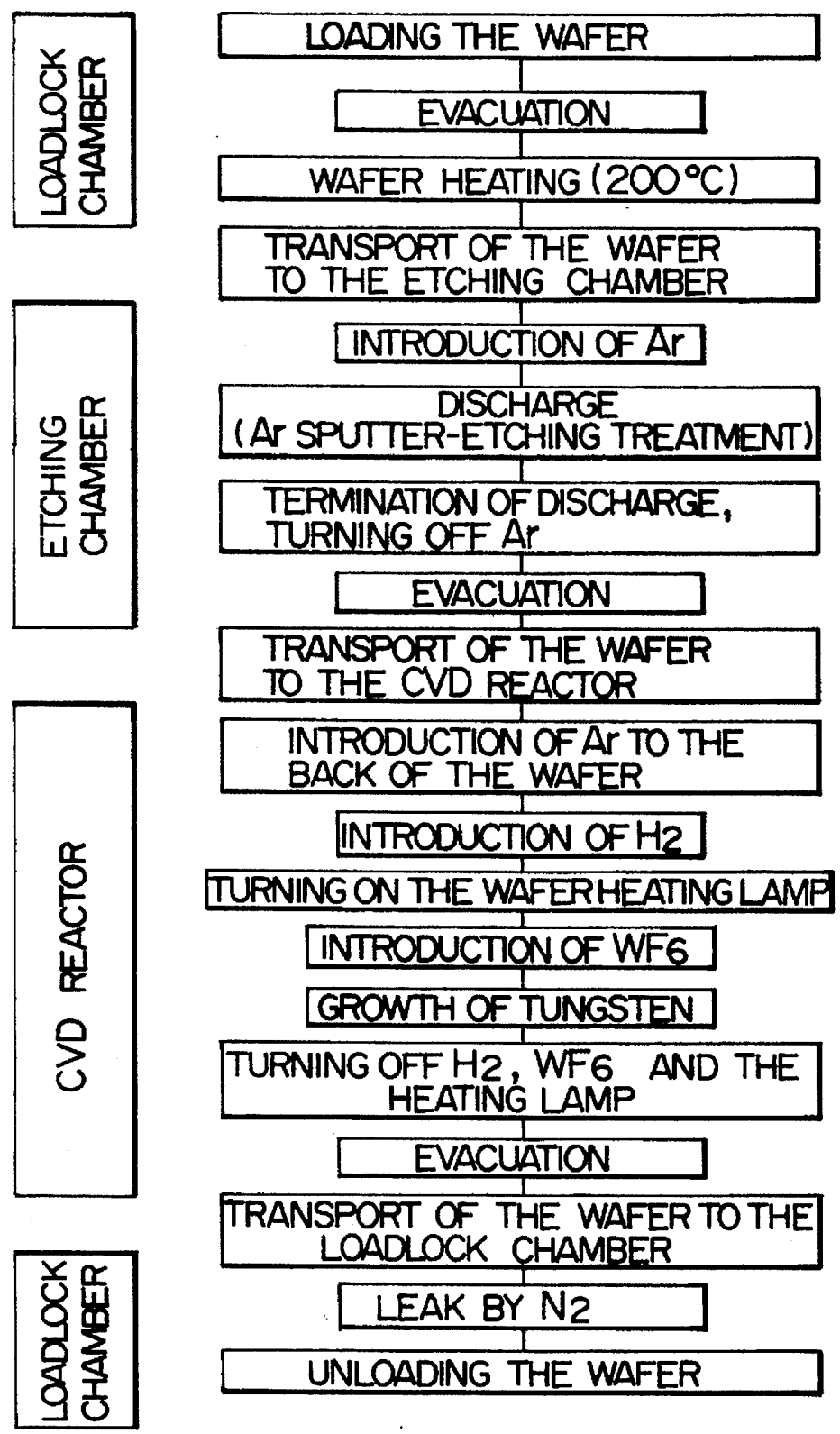
FIG. 7 is a process flow diagram of a Comparative Example wherein, among the process steps shown in FIG. 1, only the stabilization treatment by $Cl_2$ plasma is omitted.

The same apparatus and the same wafer as in Example 1-1 were used, and the wafer was treated under the same conditions as in Example 1-1 except for omitting the stabilization treatment by $Cl_2$ plasma (reference is made to Table 3). The process flow diagram of the present Comparative Example is shown in FIG. 7. This Comparative Example was conducted with the aim of confirming, though already mentioned above in the description of the effect of the present invention, what result is obtained when tungsten film growth is effected on a $SiO_2$ surface activated by Ar sputter-etching treatment. As expected, the selectivity was very poor, tungsten film grew over the whole surface after the lapse of film growth time of one minute, and also evaluation of contact resistance was impossible (reference is made to Table 4).

COMPARATIVE EXAMPLE 1-3

The same apparatus and the same wafer as in Example 1-1 were used. Unlike the above Comparative Example 1-2, the wafer was once taken out into the air after sputter-etching treatment, and then subjected to tungsten film growth treatment and subsequent treatments under the same conditions as in Comparative Example 1-2 (reference is made to Table 3). This is because some stabilization effect on the $SiO_2$ surface was expected even in naturally oxidation with $O_2$ in the air. The results of evaluation of selectivity and contact resistance are shown in Table 4. The selectivity is considerably better than in Comparative Example 1-2 and tungsten film growth over the whole surface does not occur, but a selectivity of a practically useful level is not obtained. The contact resistance is about the same extent as in Example 1-2 higher than in Example 1-1 corresponding to naturally oxidized film formed on the aluminum surface as the result of exposure to the air.

Then, Examples 1-3 to 1-6 wherein the conditions for $Cl_2$ plasma treatment are different will be described below to give further knowledge of said conditions.

EXAMPLE 1-3 AND 1-4

In Examples 1-3 and 1-4, the base pressure in the CVD reactor 3 was reduced one or two orders of magnitude, respectively, as compared with that in Example 1-1. This was for the purpose of confirming the effect of contamination of $Cl_2$ plasma by moisture and oxygen in the air, because the base pressure was controlled by artificially leaking atmospheric air into the reactor. The conditions of $Cl_2$ plasma treatment and the results of evaluation of selectivity, contact resistance and appearance by metallographic microscope are shown in Table 6. These results reveal that although selectivity is not affected at all by reduction of base pressure, discolored parts are developed in some portions of wiring and also contact resistance is increased as the base pressure is reduced.

To study the reason for this, an aluminum solid film was subjected to $Cl_2$ plasma treatment under the same conditions as in Example 1-4 and then tungsten film growth was conducted thereon in a thickness of 200 Å. The surface of the sample thus obtained was examined by SEM, and the elemental analysis of the tungsten/aluminum interface part was made with depth-direction profile of ESCA.

Resultantly, it was observed that a marked surface roughness developed on the aluminum surface and, as shown in FIG. 19, a large amount of F remained at the tungsten/aluminum interface though Cl was not detected. Thus, it is considered that leakage of $H_2O$, $O_2$ etc. of atmospheric air exerted some influence on $Cl_2$ plasma, developing a marked roughness on the aluminum surface and making it difficult for F to get out of the aluminum interface during tungsten film growth, whereby contact resistance at the tungsten/aluminum interface part was increased. The above results show that it is preferable to conduct $Cl_2$ plasma treatment under a sufficient base pressure ($10^{-6}$ Torr or less).

EXAMPLE 1-5 AND 1-6

In Example 1-5, as shown in Table 5, the conditions of $Cl_2$ plasma treatment used in Example 1 were changed in that the input power of RF was increased one order of magnitude and, in company therewith, the etch amount was increased 20 times or more. On the contrary, in Example 1-6 the input power was reduced to 2/5 and the etch amount was also decreased to 1 Å or less. The results of evaluation in these Examples are shown in Table 6. In both of the above cases, excellent results were obtained with respect to selectivity. Surprisingly, a sufficient stabilization effect was obtained in stabilization treatment by $Cl_2$ plasma even when the etch amount of $SiO_2$ surface was 1 Å or less. On the other hand, in evaluation of contact resistance and observation of cross-section by SEM, in the sample of Example 1-5, loss in film thickness of underlayer aluminum wiring was observed and the contact resistance was increased to 2–20 times that in Example 1-1. This is presumably because though the etch amount of $SiO_2$ by $Cl_2$ plasma is 70 Å, the etch rate is substantially higher for aluminum and, although it could not be confirmed by SEM, $Cl_2$ plasma of high RF power gave to the aluminum surface not a slight damage (surface roughness, etc.). In contrast, in Example 1-6, wherein RF power was reduced below that in Example 1-1, the contact resistance was excellent similarly to Example 1-1.

EXAMPLE 2

Figure 2:
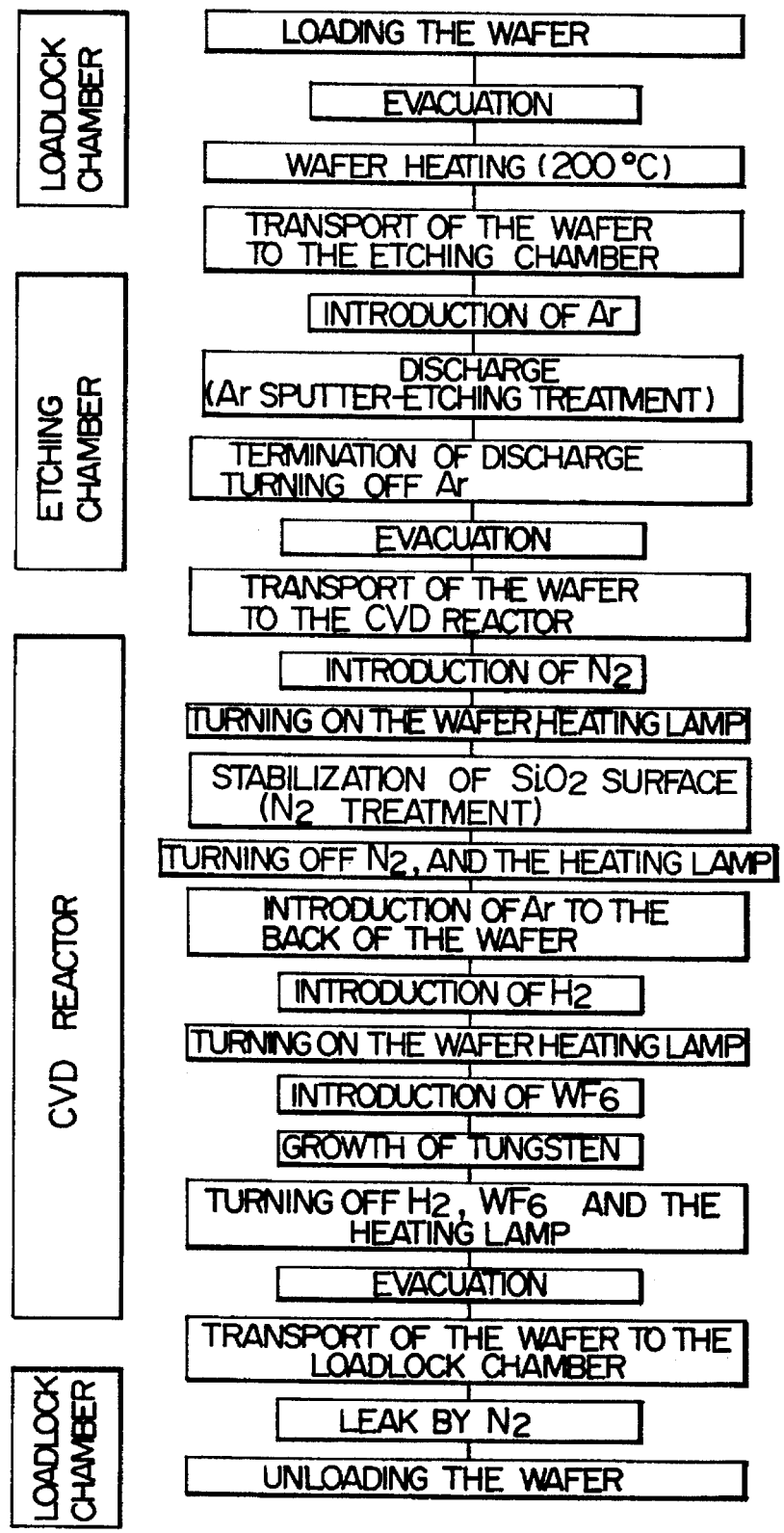
FIG. 2 is a diagram showing, among the methods of filling a through hole by metal according to the present invention, a process flow wherein the stabilization treatment of insulating film surface is effected by heat treatment of a wafer in $N_2$ atmosphere of atmospheric pressure.

FIG. 2 is a diagram showing, among the methods of filling via holes by tungsten according to the present invention, a process flow wherein the stabilization treatment of insulating film surface is effected by heat treatment of a wafer in $N_2$ atmosphere of atmospheric pressure. The same apparatus, the same wafer and the same procedures as in Example 1-1 were used except that after Ar sputter-etching treatment was conducted in the etching chamber 3, the wafer was transported to the CVD reactor 2, in which a stabilization treatment of insulating film surface was conducted by subjecting the wafer to heat treatment in $N_2$ atmosphere of atmospheric pressure. The treatment conditions and the results of evaluation in Example 2 are shown in Tables 3 and 4. An enlarged view showing the process of via filling by metal at the cross-section of a via hole in Example 2 is exactly the same as FIG. 9 in Example 1-1.

Table 4 reveals that in the sample of the present Example, a selectivity of the same level as in untreated sample can be secured and yet a good contact resistance characteristic is exhibited. Thus, it is apparent that, also in the present Example, the surface cleaning effect on the inside surface of via holes and the stabilization effect on insulating film surface are exhibited. Though an $N_2$ treatment at 300° C. for 2 minutes was conducted in the present Example, selectivity improving effect could be observed at temperatures of 200° C. or more. Further, when the extent of deterioration of insulating film surface by Ar sputter-etching treatment is large, satisfactory effect can be obtained by increasing the treating temperature or increasing the treating time according to necessity.

EXAMPLE 3

Figure 3:
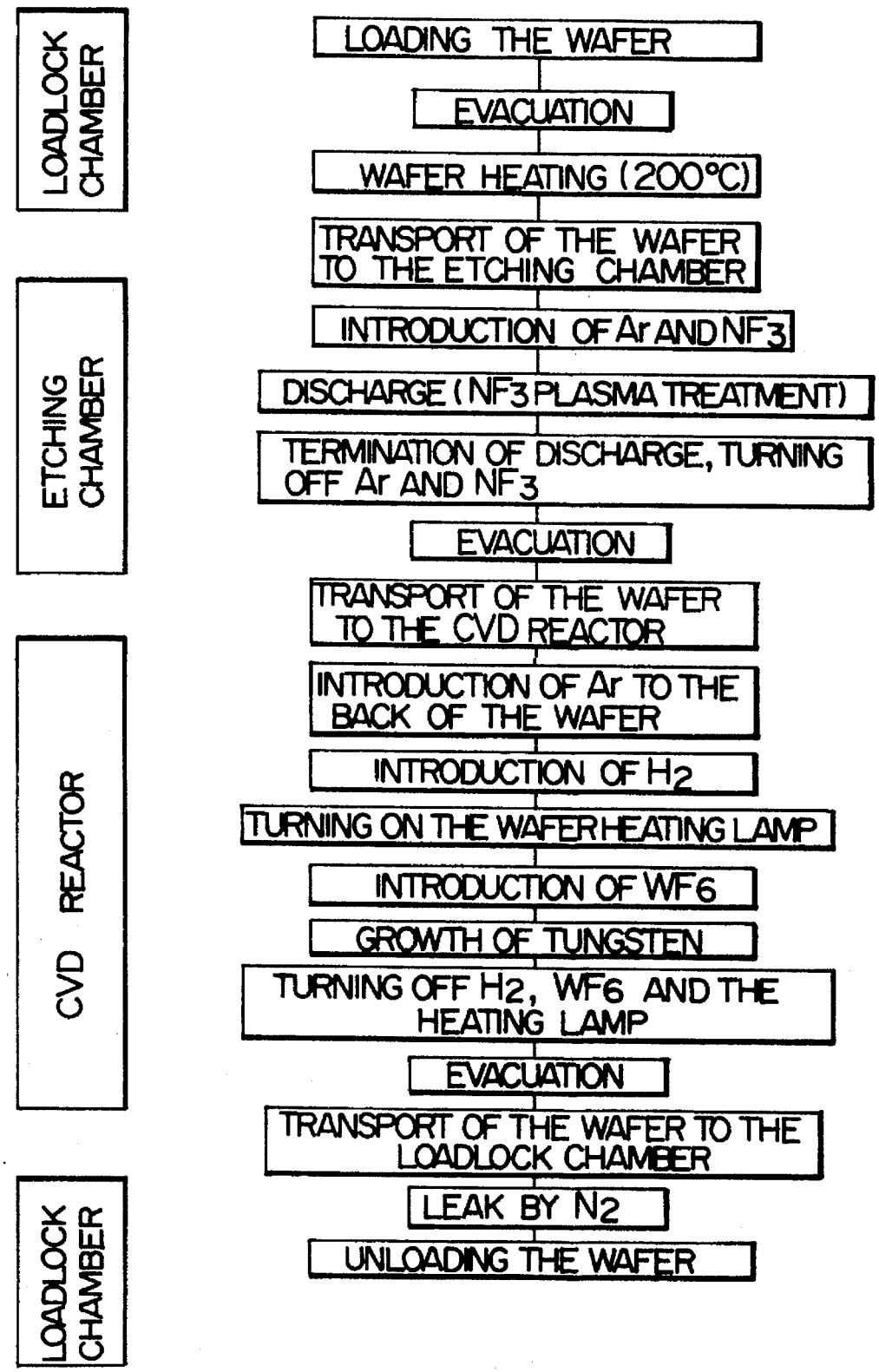
FIG. 3 is a diagram showing an embodiment of the present invention and shows a process flow wherein a surface cleaning treatment is conducted, as a pretreatment, by plasma etching using Ar incorporated with $NF_3$.

FIG. 3 is a diagram showing, among the methods for filling a via hole by tungsten, a process flow wherein a plasma etching using Ar incorporated with $NF_3$ is conducted as a pretreatment, whereby a surface cleaning treatment for removing oxide film and fouling present on aluminum wiring at the via hole bottom is effected without being accompanied by activation of insulating film surface. The same apparatus, the same wafer, and the same procedures as in Example 1-1 were used except that pretreatment was conducted by one time plasma treatment in the etching chamber 3 by introducing Ar and $BF_3$ simultaneously thereinto (reference is made to Table 3).

The conditions of treatments and the results of evaluation conducted in Example 3 are shown in Table 4. The process of via filling by metal at the cross-section of via hole in Example 3 was approximately the same as in Example 1-1 shown in FIG. 9. Difference from Example 1-1 lies in that, as described before, the etch rate of aluminum oxide ($Al_2O_3$) film shown in FIG. 12 differs greatly when $NF_3$ is incorporated into Ar from that observed when Ar gas is used alone, and not a mere physical sputtering but a chemical etching action operates in the present Example. Regarding the mechanism for this difference, although it is possible that radicals produced in $NF_3$ plasma directly etch $Al_2O_3$, it is rather natural to consider that $Al_2O_3$ is once converted to $AlF_3$ (fluorine substitution reaction) and, since $AlF_3$ is more susceptible to sputtering than $Al_2O_3$, the etch rate is increased by addition of $NF_3$ in consequence. Plasma has almost no etching ability against alumina not like as $Cl_2$ plasma. In both selectivity and contact resistance, the results in the present Example are excellent, like as those in Example 1-1 (reference is made to Example 3 of Table 4). When a fluorine-containing gas is used as a halogen gas added to Ar as shown in the present Example, corrosion of aluminum caused by the use of chlorine-containing gas shown in the following Example 4 does not take place at all.

EXAMPLE 4-1

Figure 4:
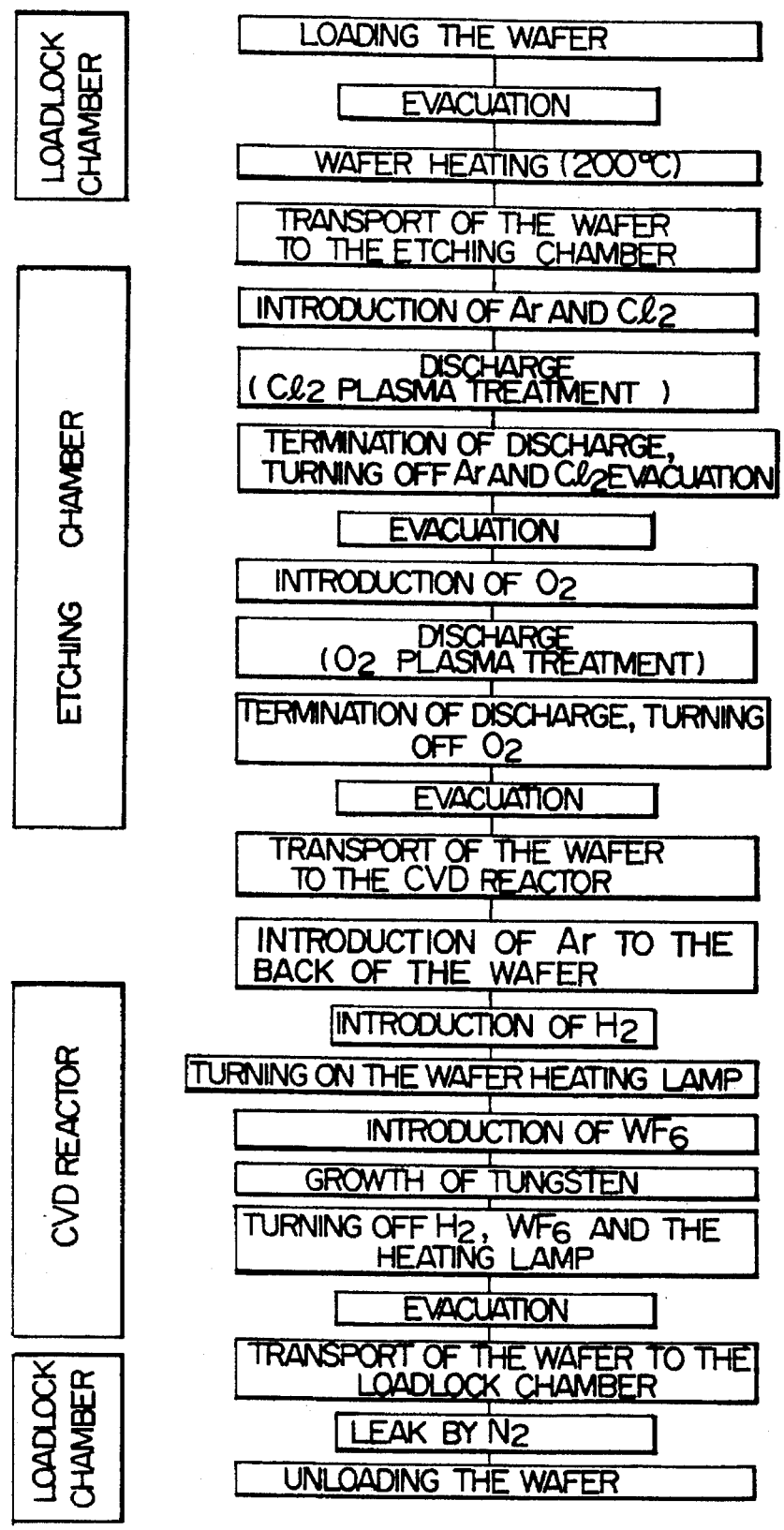
FIG. 4 is a diagram showing an embodiment of the present invention and shows a process flow wherein a surface cleaning treatment is conducted, as pretreatment, by plasma etching using Ar incorporated with $Cl_2$.
Figure 10A:
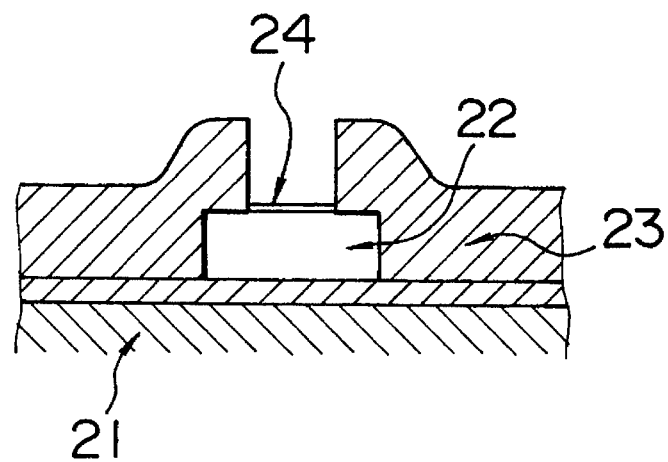
Figure 10B:
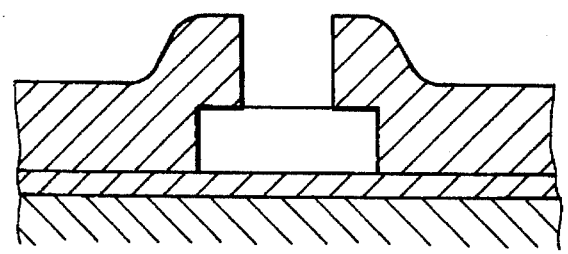
Figure 10C:
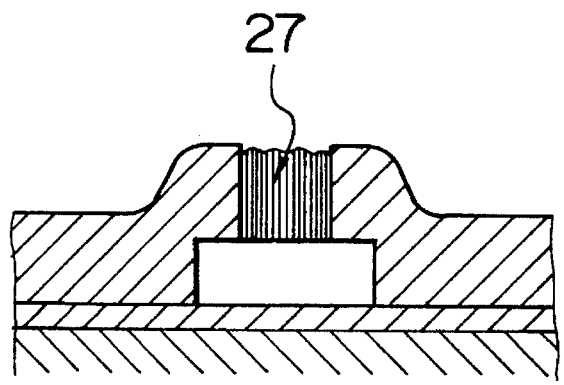
Figure 13:
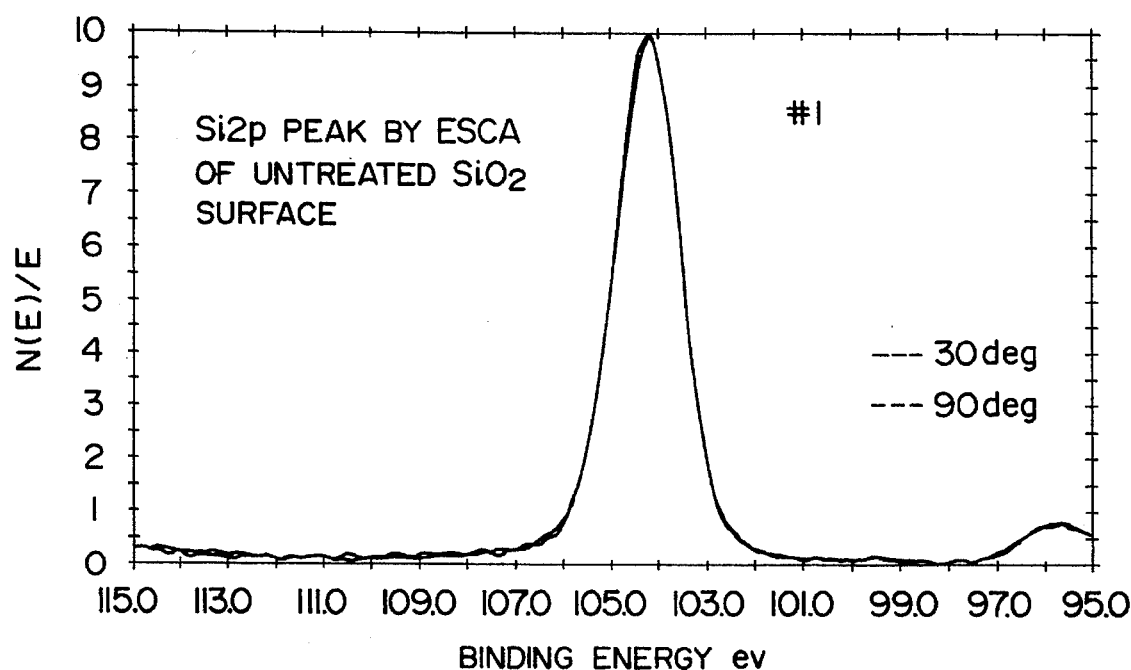
FIGS. 13–16 are respectively a graph showing a spectrum of $Si_{2p}$ peak obtained when a $SiO_2$ surface subjected to no treatment, to Ar sputter-etching treatment, or to Ar sputter-etching treatment plus $Cl_2$ plasma treatment is analyzed by ESCA.
Figure 14:
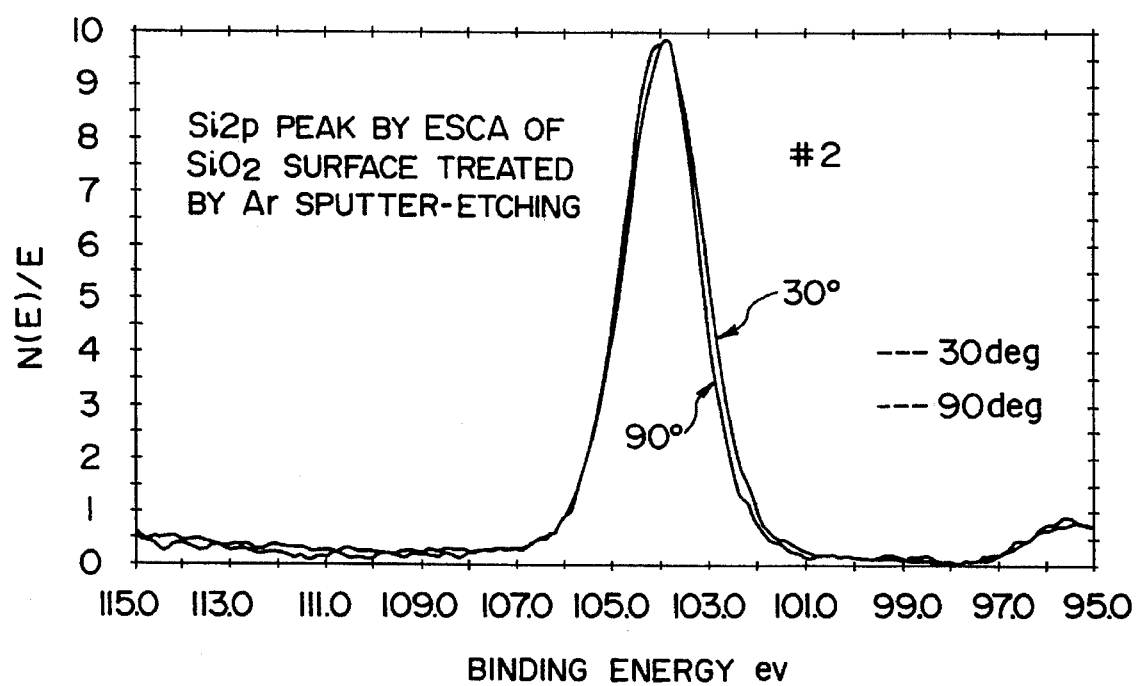
Figure 15:
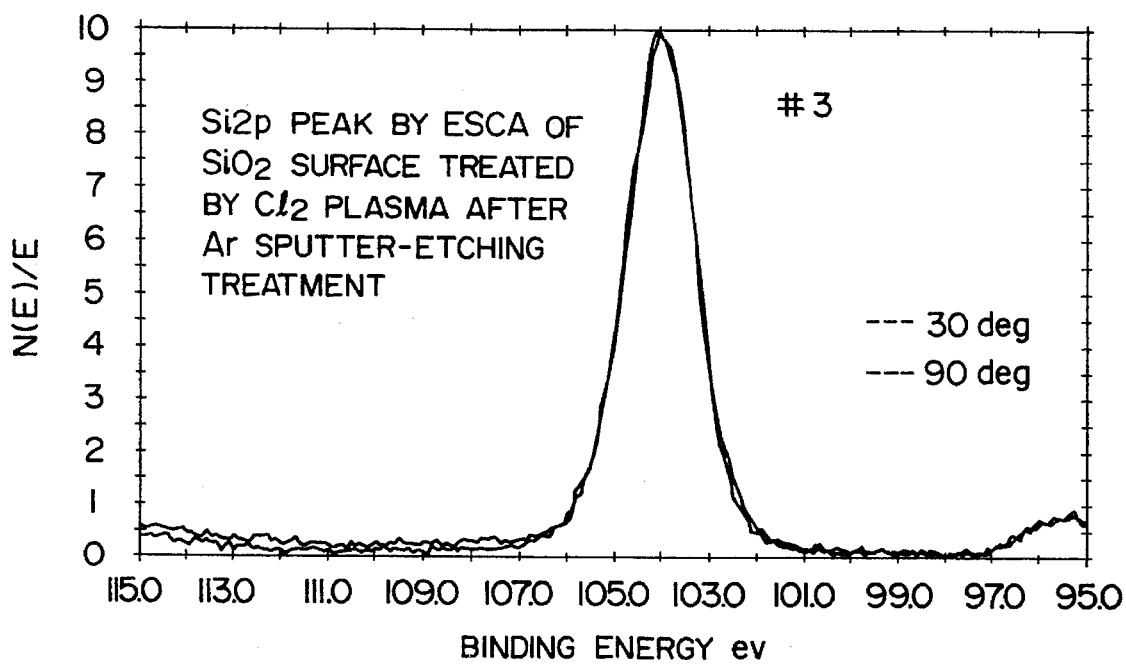
Figure 16:
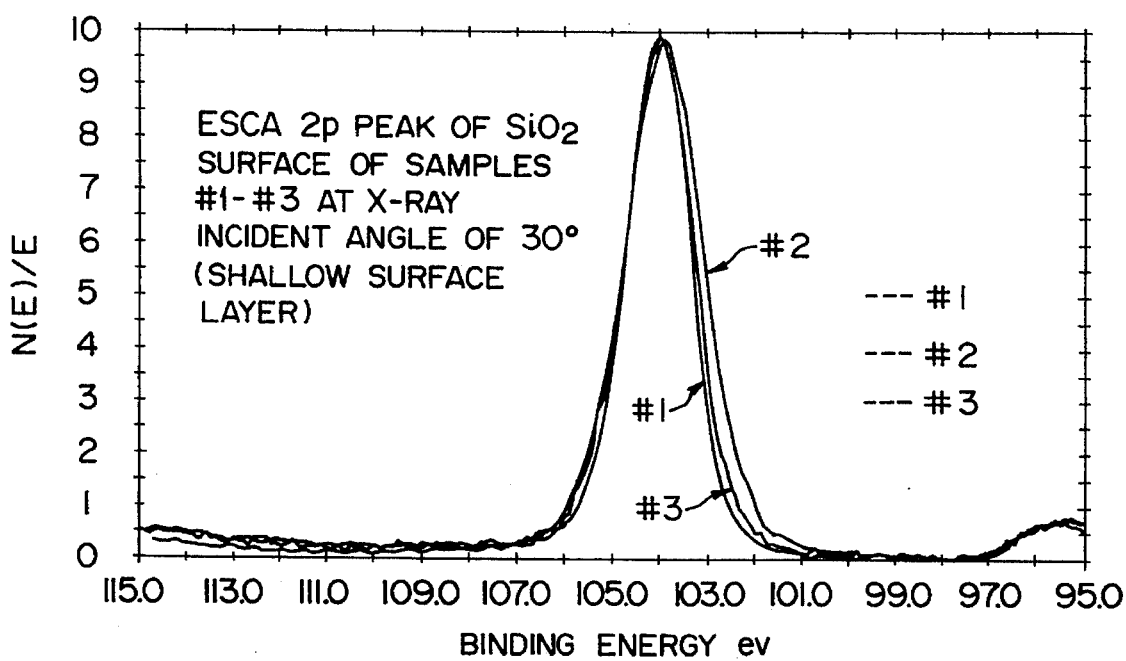
Figure 17:
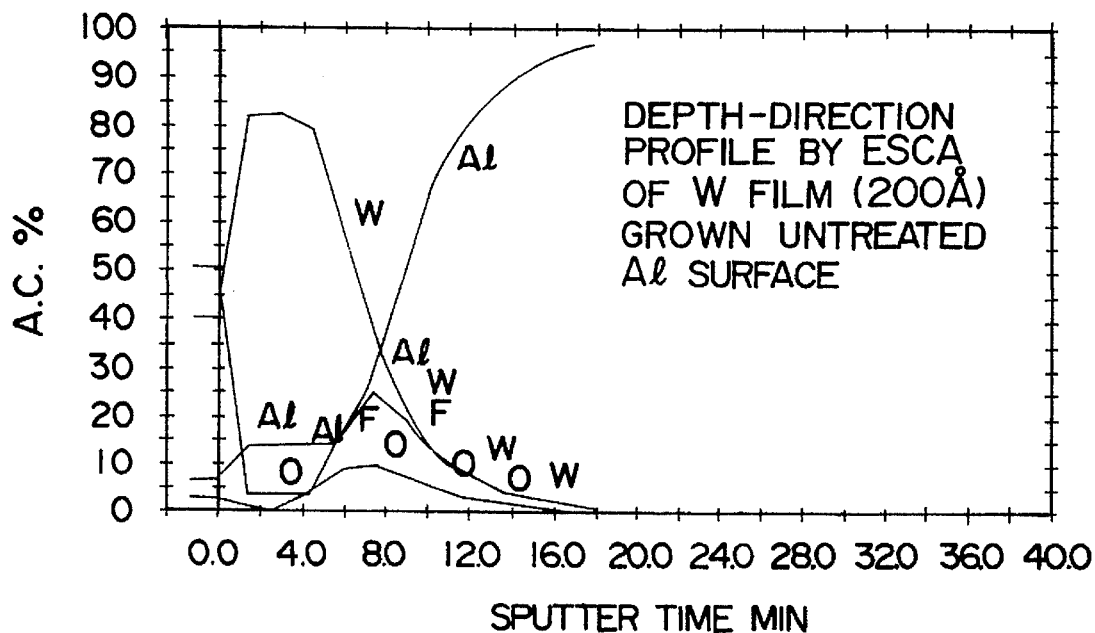
Figure 18:
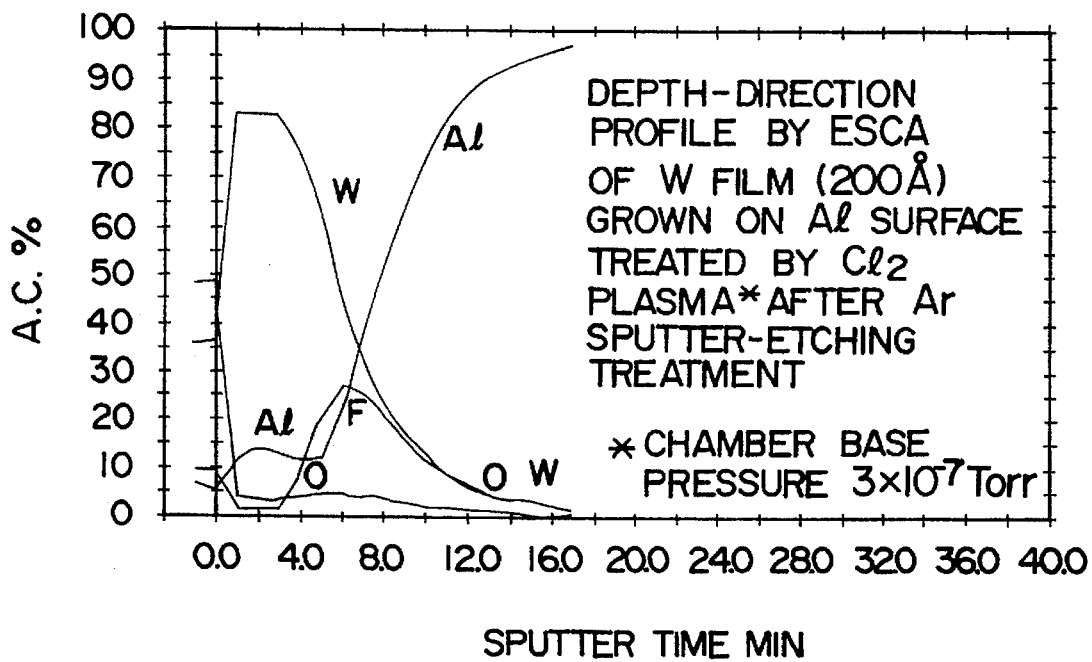

The same apparatus and the same wafer as in Example 1-1 were used. After a plasma treatment using a gas mixture of Ar/$Cl_2$ and plasma treatment using $O_2$ were continuously conducted, tungsten film growth treatment and subsequent treatments were conducted under the same conditions as in Example 1 (reference is made to Example 4-1 of Table 1). The present Example represents an example of a case wherein chlorine-containing gas (herein, $Cl_2$) is used in place of a fluorine-containing gas (e.g., $NF_3$) as plasma etching gas. FIG. 4 is a process flow diagram showing the procedures followed in Example 4-1. FIG. 10 shows an enlarged view representing the process of via filling by metal at the cross-section of a via hole in Example 4-1. Herein, difference from Example 1-1 is as follows: since a chemical etching action, not a mere physical sputtering, is used in surface cleaning treatment of aluminum surface, aluminum film resputtered onto the side wall seen in FIG. 9 (b) is not observed in FIG. 10 (b) and, in consequence, the form of via filling by tungsten assumes a form wherein tungsten grows only from the bottom of the via hole as shown in FIG. 10 (c). When this method is used, the flatness after via filling by tungsten is improved, but since a tungsten growth thickness just to meet the depth of the via hole to be filled is required, the time necessary for via filling is longer than in Example 1-1. Further, when a chlorine-containing gas ($Cl_2$) is used in the present Example, such substances as $AlCl_3$ remain on the wafer after surface cleaning treatment which will corrode aluminum when the wafer is subjected to selective CVD of tungsten and taken out into atmospheric air, unlike in using a fluorine-containing gas ($NF_3$) as in Example 3. Accordingly, the wafer should be subjected to an anticorrosive treatment of removing corrosive substances such as $AlCl_3$ therefrom before subjected to selective CVD of tungsten. In Example 4-1, an anticorrosive treatment was conducted, after plasma treatment using a gas mixture of Ar/$Cl_2$, by once terminating discharge, turning off Ar and $Cl_2$, evacuating the chamber, introducing $O_2$ and causing $O_2$ plasma discharge, and exposing the wafer to $O_2$ plasma. As shown in Example 2 of Table 2, the selectivity was excellent, being at exactly the same level as in Example 1, but, regarding contact resistance evaluation, the contact resistance at the tungsten/aluminum interface part was about twice as high as that in Example 1. Further, the film growth time required for filling 1 μm depth was somewhat longer than in Example 1. This is attributable to formation of oxide film during $O_2$ plasma treatment on the aluminum surface exposed at the via hole bottom part. That is, it is considered that the increase in interfacial resistance is due to increase in residual O at the interface and the increase in film growth time required is due to longer time required for nuclei formation at the initial stage of tungsten film growth. However, it is considered that even when a thin oxide film is once formed on the aluminum surface, the oxide decomposes at the initial stage of tungsten film growth according to the following equation and leaves substantially no O at the tungsten/aluminum interface.

$$Al_2O_3 + 3WF_6 \rightarrow 3WOF_4\uparrow + 2AlF_3 \quad (4)$$

AlF$_3$ shown in the above equation is a substance which is formed at the aluminum surface also when plasma of fluorine-containing gas is used and is considered not to be the cause of any particular problem also form the result of contact resistance evaluation. It is also possible that F is abstracted by reducing gas at the initial stage of tungsten film growth and residual F at the aluminum/tungsten interface is reduced thereby.

EXAMPLE 4-2

Figure 5:
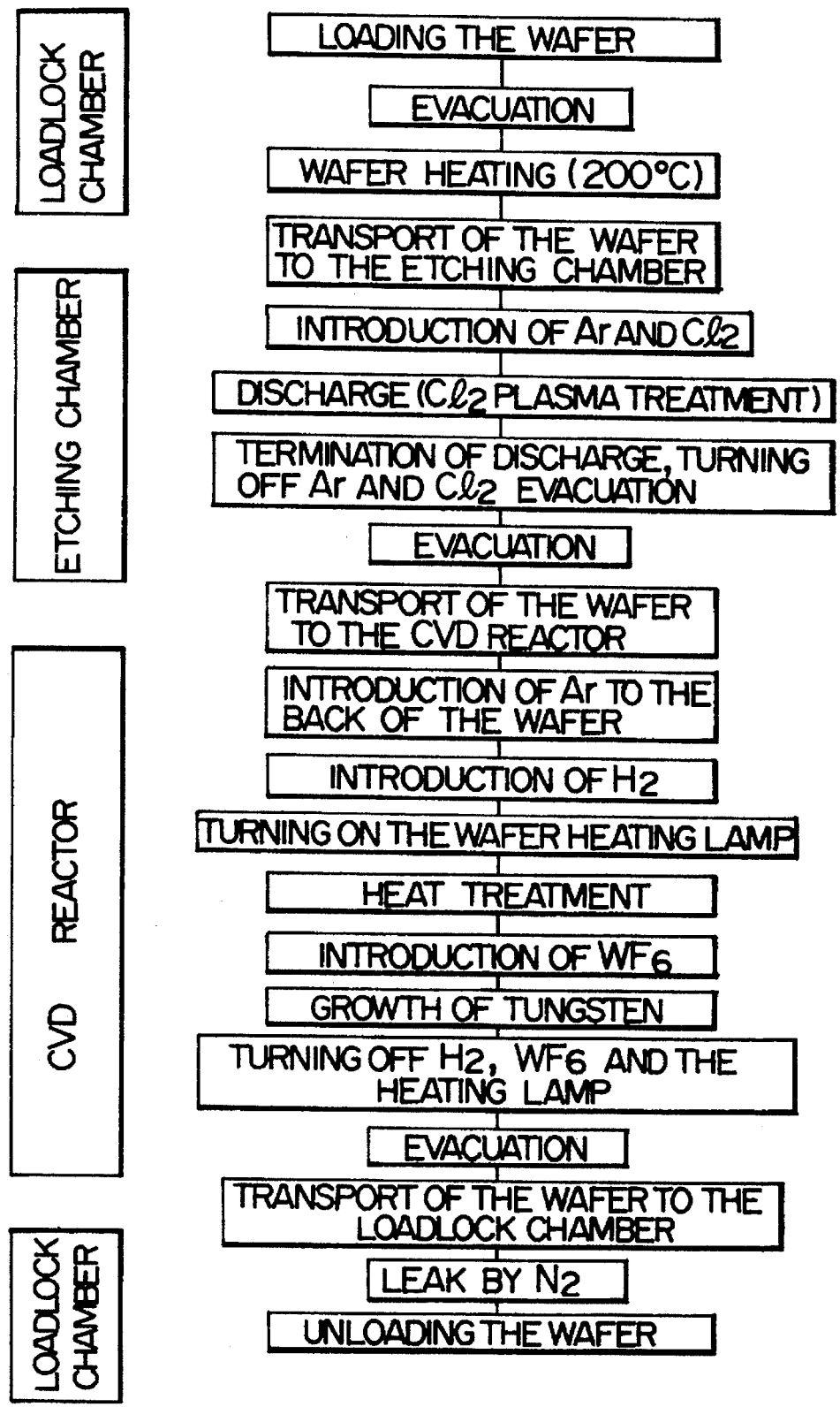
FIG. 5 is a diagram showing an embodiment of the present invention and shows a process flow wherein a plasma treatment using a gas mixture of $Cl_2$ and Ar was conducted and then a heat treatment at 450° C. was carried out in $H_2$ gas.

The process in the present Example was approximately the same as in Example 1, but the wafer was subjected to heat treatment, after transported to the CVD reactor, as an anticorrosive treatment in place of O$_2$ plasma treatment. FIG. 5 is a process flow diagram showing the procedures followed in Example 4-2. In Example 4-2, the wafer was subjected to a plasma treatment using a gas mixture of Ar/Cl$_2$, then transported to the CVD reactor 2 in the same manner as in Example 3, and subjected to heat treatment in H$_2$ gas at 450° C. for 3 minutes. The heat treatment causes corrosive substances (AlCl$_3$) to evaporate and prevents corrosion from occurring when the substrate is taken out into the air after completion of the growth of tungsten film. As shown in Example 4-2 of Table 2, the selectivity was excellent, being at exactly the same level as in Example 1-1. As to contact resistance evaluation, an approximately the same result as in Example 4-1 was obtained. This is presumably because the aluminum surface was oxidized by leaked gas from piping or residual oxygen in the CVD reactor.

As to which of the two forms of via filling by tungsten, namely, (1) via filling wherein tungsten growth from the side wall of via hole also occurs as in Examples 1-1 to Example 3 shown in FIG. 9 and (2) via filling wherein tungsten grows solely from the bottom of via hole as in the present Examples 4-1 and 4-2 shown in FIG. 10, is to be selected, it depends on the aspect ratio (hole depth/hole diameter) of via holes and to what extent does the depth vary among the holes present on the same wafer. That is, when a via hole of a small aspect ratio is filled by metal by the method of Example 1-1, there arises a situation wherein the via hole is not yet fully filled even after another hole with the same depth and a larger aspect ratio has already been filled by metal completely. On the other hand, when via holes having greatly different depths are present on the same wafer and the holes are filled by the method of Examples 4-1 and 4-2, there comes a situation wherein a deep hole is not yet fully filled even after a shallow hole has already been filled. Therefore, it is preferable to use these methods properly according to the kind of via holes.

Further, to improve throughput, it is also possible to use, at the initial stage of tungsten film growth, a H$_2$ reduction at 380° C. or higher, which can give a low contact resistance at the tungsten/aluminum interface, and after thin tungsten film has been formed over the whole surface of via hole bottom part, to change the gas to be introduced and decrease the wafer temperature to 250°–320° C. thereby to conduct a tungsten-film growth treatment by SiH$_4$ or like reducing gases capable of giving a high film growth rate. It is also possible, when required specification for contact resistance is not so severe, as in LSIs of MOS type, to conduct a tungsten film growth treatment by SiH$_4$ or a like reducing gas, capable of working at low film growth temperature, from the initial stage of tungsten film growth treatment.

Though an etch amount of 250 Å was adopted in the present Example to effect surface cleaning of via hole underlayer, selectivity is improved as compared with untreated case even at an etch amount of 10 Å or less. Thus, it is apparent from the result described already that selectivity improving effect can be obtained by using the stabilization treatment of insulating film surface by means of Cl$_2$ plasma treatment as a pretreatment for selective CVD, separately from its use as surface cleaning treatment of underlayer.

EXAMPLE 5

Figure 6:
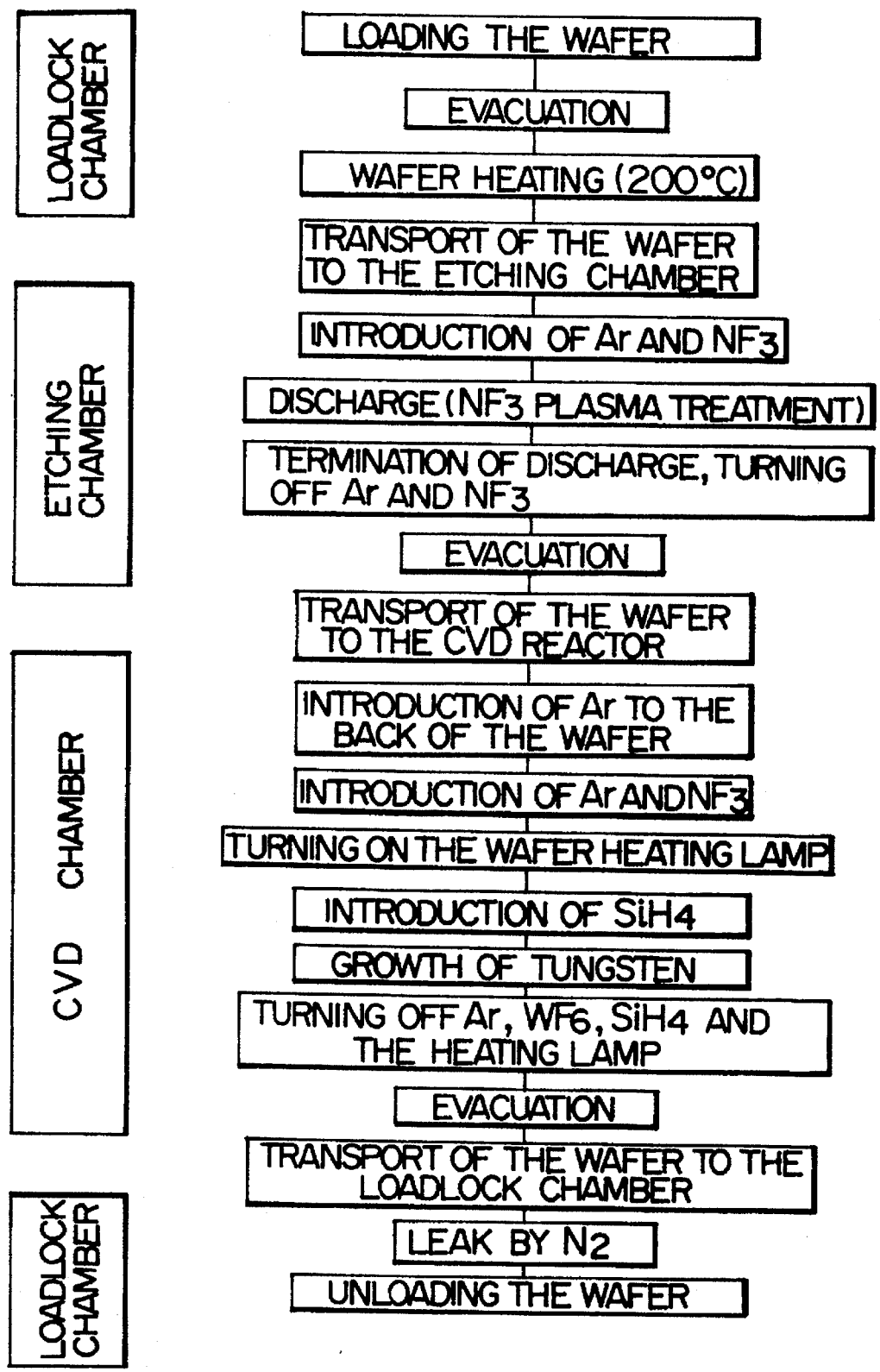
FIG. 6 is a diagram showing an embodiment of the present invention and shows a process flow wherein a surface cleaning treatment of underlayer surface and a stabilization treatment of insulating film surface are simultaneously conducted by a plasma treatment using a gas mixture of Ar and $NF_3$.

FIG. 6 is a process flow diagram of a method of filling a contact hole, i.e. a via hole with Si contact, by tungsten according to the present invention in which a surface cleaning treatment of hole bottom part where in different kinds of underlayers including doped Si, poly Si and various silicides are present mingled with one another and a stabilization treatment of insulating film surface are simultaneously conducted by a plasma treatment using a gas mixture of Ar and NF$_3$. The same apparatus and the same procedures as in Example 1 were used except that the underlayer of test wafer was different, the gas used for plasma treatment was changed from Cl$_2$ to NF$_3$, and SiH$_4$ was used as reducing gas to avoid the problems of encroachment and wormhole characteristic of Si contact in H$_2$ reduction W-CVD. The phenomena of encroachment and wormhole are described in Proc. of ECS Japan Branch First Symposium on CVD technology for VLSI (1988), p.48–65, referred to before. The conditions of treatments and the results of evaluation conducted in the present Example are shown in Tables 3 and 4. An enlarged view of a process of via filling at the cross-section contact hole in Example 5 are shown in FIG. 11 with a doped Si underlayer as an example. In FIG. 11(a), 28 is underlayer Si(n$^+$-Si and P$^+$-Si), 29 is PBSG and 30 is naturally oxidized surface film of opening part Si. FIG. 11 (a) shows a state of things before application of the treatments of FIG. 6, but the surface oxide film of contact hole bottom has been once removed beforehand by wet etching using a dilute hydrofluoric acid solution (HF: H$_2$O=1:99). Accordingly, the oxide film present at the contact hole bottom is solely a naturally oxidized film formed during the course of from drying succeeding to wet etching and water washing to loading the wafer in the loadlock chamber. FIG. 11(b) shows a state after application of plasma treatment using gas mixture of Ar and NF$_3$. Similarly to Example 3, the insulating film surface keeps a stable condition, adhered film (herein, Si film) of underlayer material resputtered onto the side wall seen in FIG. 9 (b) (Example 1-1) is not observed here, and resultantly the form of via filling by tungsten assumes a form where in tungsten grows solely from the contact hole bottom as shown in FIG. 11(c). Though SiH$_4$ was used as reducing gas in W-CVD in the present Example it is also possible, to solve the problem of poor adhesion at the tungsten/aluminum interface, to use H$_2$ reduction, which gives a good adhesion, at the initial stage of tungsten film growth and, after thin tungsten film has been formed over the whole surface of contact hole bottom part, to change the gas to be introduced and conduct tungsten film growth treatment by $SiH_4$ or a like reducing gas which gives a high film growth rate. In said $H_2$ reduction in the above method, when the film growth temperature is selected at the same temperature of about 250°–270° C. as in $SiH_4$ reduction, the problems of encroachment and tunneling do not occur. Selectivity after via filling by tungsten in 1 μm thickness is excellent as in Example 1-1. This signifies that the stabilization effect of $SiO_2$ surface does not particularly depend on the kind of halogen-containing gas, but is satisfactorily exhibited so long as the gas exerts an chemical etching action. When reactivity with underlayer is taken into consideration, however, $NF_3$ is considered particularly preferable in filling contact hole by tungsten. Also, the contact resistances of W/Si($n^+$), W/Si($p^+$), W/WSi$_2$, and W/Poly-Si interface formed by said via filling by tungsten show excellent values ($n^+$ indicates doping of $5 \times 10^{15}/cm^2$ of As+ by ion implantation at 70 KeV and $p^+$ indicates doping of $1.5 \times 10^6/cm^2$ of $BF_2^+$ by ion implantation at 60 KeV). Further, with regard to the problem described above that uniform film thickness in via filling by tungsten cannot be obtained when contact holes with different underlayers are present on the same wafer, since tungsten film growth in the present Example was conducted always under conditions where no underlayer surface oxide film is present, uniform film thickness in via filling by tungsten was obtained, and the effectiveness of the present invention was confirmed.

Although some embodiments of the present invention were described above, the present invention is not restricted to the apparatus and conditions shown the above Examples, and all of the tungsten selective CVD apparatuses having a cold-wall type CVD reactor capable of effecting a selective film growth of tungsten, an etching chamber wherein Ar sputter-etching treatment free from metallic contamination and introduction of halogen-containing gases such as $NF_3$, $Cl_2$ and $BCl_3$ are possible, and a transport mechanism capable of vacuum-transporting a wafer between the reactor and the chamber may be used by properly selecting treatment conditions. Although plasma treatment using halogen-containing gas was carried out using high frequency grow discharge plasma in the present Example, there may be used other methods which are free from metallic contamination, for example those which are used, or being studied for use, in semiconductor processes, e.g. microwave plasma method and ECR microwave plasma method. Further, though $O_2$ plasma treatment or heat treatment was shown as anticorrosive treatment in the Examples of the present invention, it is only necessary to remove corrosive substances, and other methods which are used, or being studied for use, in semiconductor processes, for example allowing a wafer to stand in $N_2$ at atmospheric pressure at high temperature by using a quartz tube furnace, may be used. Further, it is needless to say that selective CVD systems and metals intended by the present invention are not limited to selective CVD of tungsten using $WF_6$-$H_2$ system or $WF_6$-$SiH_4$ system described in above Examples, and the present invention can also be applied to other systems capable of effecting selective CVD, for example selective CVD of molybdenum using $M_oF_6$-$H_2$ system or $M_oF_6$-$SiH_4$ system, and selective CVD of aluminum using alkylaluminum as a raw material.

TABLE 1

Samples for various evaluations
(for confirmation of the effect of the invention)

| Sample No. | Material | Preparation process*) |
|---|---|---|
| #1 | $SiO_2$ | $SiO_2$ solid film, no treatment |
| #2 | $SiO_2$ | $SiO_2$ solid film + Ar sputter-etching treatment |
| #3 | $SiO_2$ | $SiO_2$ solid film + Ar sputter-etching treatment + $Cl_2$ plasma treatment |
| #4 | W-Al | Untreated Al solid film + W deposition |
| #5 | W-Al | Al solid film + Ar sputter-etching treatment + W deposition |
| #6 | W-Al | Al solid film + Ar sputter etching treatment + $Cl_2$ plasma treatment + W deposition |

Note: *)Detail treatment conditions
Ar sputter-etching treatment: base pressure = $3 \times 10^{-7}$ Torr, Ar flow rate = 100 sccm, P = 10 m Torr, RF power = 480 W (13.56 MHz), wafer bias = −550 V, etch amount = 250 Å (as $SiO_2$ film)
$Cl_2$ plasma treatment: base pressure = $3 \times 10^{-7}$ Torr, $Cl_2$ flow rate = 3 sccm, Ar flow rate = 100 sccm, P = 10 m Torr, RF power = 50 W (13.56 MHz), wafer bias = −70 V, etch amount = about 3 Å (as $SiO_2$ film)
W deposition: $WF_6$ flow rate = 3 sccm, $H_2$ flow rate = 500 sccm, Ar flow rate = 4 sccm, Pressure P = 0.66 Torr, wafer temp. T = 370° C.

TABLE 2

Results of elements analysis of $SiO_2$ surface by ESCA

| Sample No. | O/Si content ratio*) |
|---|---|
| #1 | 2.181 |
| #2 | 2.087 |
| #3 | 2.383 |

Note: *)Including O adsorbed onto surface

TABLE 3

Samples preparation conditions (1)

| Example No. | Under-layer of via hole | Pretreatment*) | Connection betweene pretreatment and W deposition | W deposition | Remarks |
|---|---|---|---|---|---|
| Example 1-1 | Al | Ar sputter-etching tratment + $Cl_2$ plasma treatment | Continuous | $WF_6$ = 3 sccm, $H_2$ = 500 sccm, Ar = 4 sccm P = 0.66 Torr, T = 450° C. | Process flow FIG. 1 |
| Example 1-2 |  | Ar sputter-etching tratment + $Cl_2$ plasma treatment | Discontinuous (Wafer in the air) | ↑ |  |
| Comp. Example 1-1 | Al | None | — | ↑ |  |
| Comp. Example | Al | Ar sputter-etching treatment | Continuous | ↑ | Process flow FIG. 7 |

TABLE 3-continued

| | | Samples preparation conditions (1) | | | |
|---|---|---|---|---|---|
| Example No. | Under-layer of via hole | Pretreatment*) | Connection betweene pretreatment and W deposition | W deposition | Remarks |
| Example 1-2 | Al | Ar sputter-etching treatment | Discontinuous (wafer in the air) | ↑ | |
| Comp. Example 1-3 | Al | Ar sputter-etching tratment + $N_2$ treatment | Continuous | ↑ | Process flow FIG. 2 |
| Example 2 | Al | Plasma treatment using $Ar/NF_3$ mixture *[1]) | Continuous | ↑ | Process flow FIG. 3 |
| Example 3 | Al | Plasma treatment using $Ar/Cl_2$ mixture + $O_2$ plasma treatment | Continuous | ↑ | Process flow FIG. 4 |
| Example 4-1 | Al | Plasma treatment using $Ar/Cl_2$ mixture + heat treatment | Continuous | ↑ | Process flow FIG. 5 |
| Example 4-2 | Si($p^+$), Si($n^+$) $WSi_2$, poly-Si | Plasma treatment using $Ar/NF_3$ mixture *[2]) | Continuous | $SiH_4$ = 4 sccm, $WF_6$ = 5 sccm, Ar = 100 sccm P = 50 mTorr, T = 270° C. | Process flow FIG. 6 |
| Example 5 | | | | | |

Note *)Detail pretreatment conditions
Ar sputter-etching treatment: base pressure = $3 \times 10^{-7}$ Torr, Ar flow rate = 100 sccm, P = 10 m Torr, RF power = 480 W (13.56 MHz), wafer bias = −550 V, etch amount = 250 Å (as $SiO_2$ film)
$Cl_2$ plasma treatment: base pressure = $3 \times 10^{-7}$ Torr, $Cl_2$ flow rate = 3 sccm, Ar flow rate = 100 sccm, P = 10 m Torr, RF power = 50 W (13.56 MHz), wafer bias = −70 V, etch amount = about 3 Å (as $SiO_2$ film)
$N_2$ treatment: $N_2$ flow rate = 10 l/min (atmospheric pressure), T = 300° C., Treating time = 2 min
Plasma treaitment using $Ar/NF_3$ mixture *[1]): base pressure = $3 \times 10^{-7}$ Torr, $NF_3$ flow rate = 5 sccm, Ar flow rate = 100 sccm, P = 10 mTorr, RF power = 50 W (13.56 MHz), wafer bias = −70 V
Plasma treatment using $Ar/Cl_2$ mixture: base pressure = $3 \times 10^{-7}$ Torr, $Cl_2$ flow rate = 9 sccm, Ar flow rate = 100 sccm, P = 10 mTorr, RF power = 150 W (13.56 MHz), wafer bias = −200 V
$O_2$ plasma treatment: $O_2$ flow rate = 100 sccm, P = 10 mTorr, RF power = 150 W (13.56 MHz)
Heat treatment: 450° C., $H_2$ = 100 sccm, P = 0.66 Torr, 3 min
Plasma treatment using $Ar/NF_3$ mixture*[2]): base pressure $3 \times 10^{-7}$ Torr, $NF_3$ flow rate = 3 sccm, Ar flow rate = 100 sccm, P = 10 mTorr, RF power = 150 W (13.56 MHz), wafer bias = −260 V, etch amount = about 30 Å (as $SiO_2$ film)

TABLE 4

| | | Properties of samples of Example (1) | | | |
|---|---|---|---|---|---|
| Example No. | Under-layer of via hole | Selectivity*) [Number of tungsten nuclei on insulating film (number/$cm^2$)] | Contact resistance (W/Underlayer) ($\Omega/\mu m^\square$) | Time required for via filling (min) | Remarks |
| Example 1-1 | Al | ⊙ [$5 \times 10$–$5 \times 10^2$] | 0.10–0.15 | 3.0 | |
| Example 1-2 | Al | ⊙ [$5 \times 10$–$5 \times 10^2$] | 0.30–0.52 | 3.2 | |
| Comp. Example 1-1 | Al | ○ [$5 \times 10^2$–$5 \times 10^3$] | >20 | 8.0 | |
| Comp. Example 1-2 | Al | XX [Deposition on whole surface] | not determined | — | Deposition on whole surface of wafer about 1 min after initiation of W deposition |
| Comp. Example 1-3 | Al | X [$5 \times 10^3$–$5 \times 10^5$] | 0.40–0.62 | 3.2 | |
| Example 2 | Al | ○ [$5 \times 10^2$–$5 \times 10^3$] | 0.14–0.18 | 3.0 | |
| Example 3 | Al | ⊙ [$5 \times 10$–$5 \times 10^2$] | 0.10–0.15 | 3.0 | |
| Example 4-1 | Al | ⊙ [$5 \times 10$–$5 \times 10^2$] | 0.20–0.40 | 5.5 | |
| Example 4-2 | Al | ⊙ [$5 \times 10$–$5 \times 10^2$] | 0.16–0.40 | 5.0 | |
| Example 5 | Si($p^+$), Si($n^+$) $WSi_2$, poly-Si | ⊙ [$5 \times 10$–$5 \times 10^2$] | 10–50 (Si($p^+$)), 50–10 (Si($n^+$)), 1–2 ($WSi_2$), 1–2 (poly-Si) | 1.5 | |

Note: *)Selectivity: Excellent ← ⊙ ○ X XX → Poor

TABLE 5

| | Conditions of $Cl_2$ plasma treatment | | | | | |
|---|---|---|---|---|---|---|
| Example No. | Base pressure (Torr) | RF power (W) | Wafer bias (V) | Etch amount (Å) | Other conditions | Remarks |
| Example 1-3 | $3 \times 10^{-6}$ | 50 | −70 | ~3 | Same as in Example 1-1 | Process flow FIG. 1 |
| Example 1-4 | $3 \times 10^{-5}$ | 50 | −70 | ~3 | ↑ | ↑ |
| Example 1-5 | $3 \times 10^{-7}$ | 500 | −480 | 70 | ↑ | ↑ |
| Example 1-6 | $3 \times 10^{-7}$ | 20 | −30 | ~1 | ↑ | ↑ |

Note: *)Calculated in terms of $SiO_2$ film

TABLE 6

| | | Properties of samples of Examples (2) | | | |
|---|---|---|---|---|---|
| Example No. | Under-layer of via hole | Selectivity*) [Number of tungsten nuclei on insulating film (number/cm$^2$)] | Contact resistance (W/Underlayer) ($\Omega/\mu m^\square$) | Time required for via filling (min) | Remarks |
| Example 1-3 | Al | ⊙ [$5 \times 10$–$5 \times 10^2$] | 0.10–0.75 | 3.0 | Disclosed part developed in parts of under-layer Al wiring |
| Example 1-4 | Al | ⊙ [$5 \times 10$–$5 \times 10^2$] | 5.5–8.5 | 3.0 | Disclosed part developed in parts of under-layer Al wiring |
| Example 1-5 | Al | ⊙ [$5 \times 10$–$5 \times 10^2$] | 0.20–3.0 | 3.0 | Film thickness decrease observed in underlayer Al wiring |
| Example 1-6 | Al | ⊙ [$5 \times 10$–$5 \times 10^2$] | 0.10–0.14 | 3.0 | |

Note: *)Selectivity: Excellent ← ⊙ O X XX → Poor

As described in the foregoing, in filling small via holes provided to insulating film on a wafer to expose parts of the underlayer of the wafer by means of selective CVD of metal, according to the method of the present invention which essentially comprises applying, before application of CVD, a surface cleaning treatment of said underlayer by Ar sputter-etching and a stabilization treatment of insulated film surface activated in said cleaning treatment successively or simultaneously, and optionally applying an anti-corrosive treatment to the underlayer, and then applying a selective CVD treatment without exposing the underlayer subjected to above treatments to the air, via filling which gives good selectivity and low interfacial resistance between underlayer metal and via-filling metal can be accomplished. Accordingly, the present invention can contribute to improving the reliability of multilayer wiring of LSIs and multilayer printed boards of computors where filling of connecting via holes by metal is necessary.

We claim:

1. A process for forming a multilayer wiring in a fabricated wafer, said multilayer wiring comprising a plurality of wirings stacked via silicon and oxygen-containing insulating layers each provided between one and another of said wirings, one of said wirings being electrically connected to another wiring through via-holes, which comprises the steps of:

(a) introducing into a pretreatment chamber said fabricated wafer having the wirings, one of which is covered thereon by the insulating layers except said via-holes, the surfaces of the wiring exposed at the via-holes being covered by a native oxide of the wiring;

(b) introducing a rare gas into said pretreatment chamber and then forming a plasma in said chamber by electric discharge to physically remove an amount of said oxide from the exposed surfaces due to the collision of plasma particles against the surfaces;

(c) introducing an etching gas into said chamber, then forming a plasma in said pretreatment chamber by electric discharge and introducing said fabricated wafer from step (b) into said plasma, thereby increasing the oxygen content of the surface of said insulating layers as reduced during the physical removal of the oxide in step (b) to restore the reduced oxygen/silicon ratio of the surface of the insulating layers, to that before the pretreatment of step (b);

(d) ceasing the introduction of both the rare gas and etching gas in said pretreatment chamber and then evacuating said pretreatment chamber;

(e) subjecting the exposed surfaces of the wiring to a treatment for corrosion prevention and transferring said fabricated wafer to an evacuated deposition chamber; and, (f) introducing a deposition material gas into said deposition chamber containing the corrosion-prevention treated wafer placed therein, and selectively depositing said material only on said exposed surfaces of the wiring in said via-holes to fill said via-holes with the deposited material; and, (g) preparing another wiring on said insulating layers.

2. The process according to claim 1, wherein said etching gas is a gas at least containing chlorine or a chlorine compound.

3. The process according to claim 1, wherein said treatment for corrosion prevention is carried out in said pretreatment chamber.

4. The process according to claim 1, wherein said treatment for corrosion prevention is carried out in a chamber separately provided, containing said fabricated wafer transferred thereto from said pretreatment chamber.

5. The process according to claim 1, wherein said treatment for corrosion prevention is carried out in said deposition chamber.

6. The process according to claim 1, wherein said treatment for corrosion prevention is carried out by heating said fabricated wafer under vacuum or in an atmosphere of one or more of nitrogen gas, hydrogen gas, and a rare gas at a higher wafer temperature than that used in the subsequent depositing step (f).

7. A process for forming a multilayer wiring in a fabricated wafer, said multilayer wiring comprising a plurality of wirings stacked via silicon and oxygen-containing insulating layers each provided between one and another of said wirings, one of said wirings being electrically connected to another wiring through via-holes, which comprises the steps of:

(a) introducing into a pretreatment chamber said fabricated wafer having the wirings, one of which is covered thereon by the insulating layers except said via-holes, the surfaces of the wiring exposed at the via-holes being covered by a native oxide of the wiring;

(b) introducing a rare gas into said pretreatment chamber, then forming a plasma in said chamber by electric discharge to physically remove an amount of said oxide from the exposed surfaces due to the collision of plasma particles against the surfaces, and ceasing the introduction of the rare gas in the pretreatment chamber;

(c) introducing an etching gas into said chamber, then forming a plasma in said pretreatment chamber by electric discharge and introducing said fabricated wafer from step (b) into said plasma, thereby increasing the oxygen content of the surface of said insulating layers as reduced during the physical removal of the oxide in step (b) to restore the reduced oxygen/silicon ratio of the surface of the insulating layers, to that before the pretreatment of step (b);

(d) ceasing the introduction of the etching gas in said pretreatment chamber and then evacuating said pretreatment chamber;

(e) subjecting the exposed surfaces of the wiring to a treatment for corrosion prevention and transferring said fabricated wafer to an evacuated deposition chamber; and, (f) introducing a deposition material gas into said deposition chamber containing the corrosion-prevention treated wafer placed therein, and selectively depositing said material only on said exposed surfaces of the wiring in said via-holes to fill said via-holes with the deposited material; and, (g) preparing another wiring on said insulating layers.

8. The process according to claim 7, wherein said etching gas is a gas at least containing chlorine or a chlorine compound.

9. The process according to claim 7, wherein said treatment for corrosion prevention is carried out in said pretreatment chamber.

10. The process according to claim 7, wherein said treatment for corrosion prevention is carried out in a chamber separately provided, containing said fabricated wafer transferred thereto from said pretreatment chamber.

11. The process according to claim 7, wherein said treatment for corrosion prevention is carried out in said deposition chamber.

12. The process according to claim 7, wherein said treatment for corrosion prevention is carried out by heating said fabricated wafer under vacuum or in an atmosphere of one or more of nitrogen gas, hydrogen gas, and a rare gas at a higher wafer temperature than that used in the subsequent depositing step (f).

13. A process for forming a multilayer wiring in a fabricated wafer, said multilayer wiring comprising a plurality of wirings stacked via silicon and oxygen-containing insulating layers each provided between one and another of said wirings, one of said wirings being electrically connected to another wiring through via-holes, which comprises the steps of:

(a) introducing into a pretreatment chamber said fabricated wafer having the wirings, one of which is covered thereon by the insulating layers except said via-holes, the surfaces of the wiring exposed at the via-holes being covered by a native oxide of the wiring;

(b) introducing a rare gas and an etching gas or an etching gas alone, forming a plasma of said gases or gas by electric discharge, and exposing said fabricated wafer to the plasma, to physically remove an amount of said oxide from the exposed surfaces due to the collision of plasma particles against the surfaces and chemically removing an amount of said oxide with radicals in said plasma, while simultaneously increasing the oxygen content of the surface of said insulating layer to restore the oxygen/silicon ratio of the surface of the insulating layer, which was reduced during the removal of the oxide film, to that before the pretreatment of step (a);

(c) ceasing the introduction of the rare gas and the etching gas or the etching gas alone in said pretreatment chamber and then evacuating said pretreatment chamber;

(d) subjecting the exposed surfaces of the wiring to a treatment for corrosion prevention and transferring said fabricated wafer to an evacuated deposition chamber; and, (e) introducing a deposition material gas into said deposition chamber containing the corrosion-prevention treated wafer placed therein, and selectively depositing said material only on said exposed surfaces of the wiring in said via-holes to fill said via-holes with the deposited material; and, (f) preparing another wiring on said insulating layers.

14. The process according to claim 13, wherein said etching gas is a gas at least containing chlorine or a chlorine compound.

15. The process according to claim 13, wherein said treatment for corrosion prevention is carried out in said pretreatment chamber.

16. The process according to claim 13, wherein said treatment for corrosion prevention is carried out in a chamber separately provided, containing said fabricated wafer transferred thereto from said pretreatment chamber.

17. The process according to claim 13, wherein said treatment for corrosion prevention is carried out in said deposition chamber.

18. The process according to claim 13, wherein said treatment for corrosion prevention is carried out by heating said fabricated wafer under vacuum or in an atmosphere of one or more of nitrogen gas, hydrogen gas, and a rare gas at a higher wafer temperature than that used in the subsequent depositing step (f).

* * * * *